(12) United States Patent
Kondo

(10) Patent No.: US 7,154,583 B2
(45) Date of Patent: Dec. 26, 2006

(54) MOVEMENT METHOD, EXPOSURE METHOD AND EXPOSURE APPARATUS, AND DEVICE MANUFACTURING METHOD

(75) Inventor: Makoto Kondo, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/203,228

(22) Filed: Aug. 15, 2005

(65) Prior Publication Data

US 2005/0270507 A1   Dec. 8, 2005

Related U.S. Application Data

(63) Continuation of application No. PCT/JP2004/001880, filed on Feb. 19, 2004.

(30) Foreign Application Priority Data

Feb. 19, 2003   (JP) ............... 2003-040789

(51) Int. Cl.
  *G03B 27/42* (2006.01)
(52) U.S. Cl. .................. 355/53; 355/72; 355/75
(58) Field of Classification Search ............ None
  See application file for complete search history.

(56) References Cited

U.S. PATENT DOCUMENTS

| | | |
|---|---|---|
| 4,742,286 A | 5/1988 | Phillips |
| 4,775,877 A | 10/1988 | Kosugi et al. |
| 4,780,617 A | 10/1988 | Umatate et al. |
| 4,962,318 A | 10/1990 | Nishi |
| 5,448,332 A | 9/1995 | Sakakibara et al. |
| 5,525,808 A | 6/1996 | Irie et al. |
| 5,534,970 A | 7/1996 | Nakashima et al. |
| 6,262,796 B1 | 7/2001 | Loopstra et al. |
| 6,278,957 B1 | 8/2001 | Yasuda et al. |
| 6,327,026 B1 | 12/2001 | Wakui |
| 6,341,007 B1 | 1/2002 | Nishi et al. |
| 6,576,919 B1 | 6/2003 | Yoshida |
| 6,940,582 B1* | 9/2005 | Tanaka ................... 355/53 |
| 2001/0053962 A1 | 12/2001 | Yoshida et al. |

FOREIGN PATENT DOCUMENTS

| | | |
|---|---|---|
| JP | A 61-44429 | 3/1986 |
| JP | A 2-54103 | 2/1990 |
| JP | A 2-283011 | 11/1990 |
| JP | A 6-283403 | 10/1994 |
| JP | A 6-349701 | 12/1994 |
| JP | 09246360 | * 9/1997 |
| JP | A 10-303126 | 11/1998 |
| JP | A 10-312961 | 11/1998 |

(Continued)

*Primary Examiner*—D. Rutledge
(74) *Attorney, Agent, or Firm*—Oliff & Berridge, PLC

(57) ABSTRACT

When a wafer is moved from a first position to a second position along a path where alignment marks pass through an alignment detection system, wafer table is to be moved along a path whose standstill time of a Y linear motor, which drives the wafer table in the Y-axis direction, and an X linear motor, which drives the wafer table in the X-axis direction orthogonal to the Y-axis direction, is minimum. In this case, the time for both linear motors to drive the wafer table simultaneously is increased as much as possible, and during such simultaneous drive, the movement distance of the wafer can be increased compared with the case when the wafer table is driven using only one of the linear motors. As a result, the time required to move wafer from the first position to the second position can be reduced.

22 Claims, 11 Drawing Sheets

FOREIGN PATENT DOCUMENTS

| | | |
|---|---|---|
| JP | A 11-274031 | 10/1999 |
| JP | A 2000-77301 A | 3/2000 |
| JP | B2 3289264 | 3/2002 |
| JP | B2 3339079 | 8/2002 |
| JP | B2 3348918 | 9/2002 |
| WO | WO98/24115 | 6/1998 |
| WO | WO 98/40791 | 9/1998 |
| WO | WO 01/18944 A1 | 3/2001 |
| WO | WO 01/22480 A1 | 3/2001 |

* cited by examiner

MOVEMENT METHOD, EXPOSURE
METHOD AND EXPOSURE APPARATUS,
AND DEVICE MANUFACTURING METHOD

CROSS-REFERENCE TO RELATED
APPLICATIONS

This is a continuation of International Application PCT/JP2004/001880, with an international filing date of Feb. 19, 2004, the entire content of which being hereby incorporated herein by reference, which was not published in English.

BACKGROUND OF THE INVENTION

1. Field of the Invention

The present invention relates to movement methods, exposure methods and exposure apparatus, and device manufacturing methods, and more particularly to an exposure method and exposure apparatus that transfer a predetermined pattern onto an object in a lithography process where semiconductor devices or the like are manufactured, a movement method that can be suitably applied for moving a movable body on which the object is mounted, and a device manufacturing method that uses the exposure method and the exposure apparatus.

2. Description of the Related Art

In a lithography process to produce microdevices such as a semiconductor device or a liquid crystal display device, exposure apparatus are used that transfer a pattern formed on a mask or a reticle (hereinafter generally referred to as a 'reticle') via a projection optical system onto a photosensitive object such as a wafer or a glass plate whose surface is coated with a resist or the like (hereinafter generally referred to as a 'wafer'). For example, a reduction projection exposure apparatus by a step-and-repeat method (the so-called stepper), and a scanning projection exposure apparatus by a step-and-scan method (the so-called scanning stepper (also called a scanner)), which is an improvement of the stepper, are mainly used.

Because semiconductor devices or the like are manufactured overlaying a plurality of layers of patterns on the wafer, in exposure apparatus such as the stepper, an operation (alignment) is necessary to make an optimal relative positional relation between the pattern formed in advance on the wafer and the pattern formed on the reticle. As the alignment method, the EGA (Enhanced Global Alignment) method is mainly used. The details on this method are disclosed in, Japanese Patent Application No. 61-44429 and the corresponding U.S. Pat. No. 4,780,617. In the alignment by the EGA method, a specific plurality of shot areas (also referred to as sample shot areas or alignment shot areas) in the wafer are selected in advance, and the positional information on alignment marks (sample marks) arranged in such sample shot areas is sequentially measured, and by using the measurement results and the designed array information on the shot areas, statistical calculation by the least-squares method is performed in order to obtain the array coordinates of the shot areas on the wafer. Therefore, in the alignment by the EGA method, the array coordinates of each shot area can be obtained at a high throughput, with a relatively high precision.

In the above alignment, because alignment marks arranged on a plurality of sample shot areas have to be measured, the wafer has to be moved along a path that allows the plurality of alignment marks to be sequentially positioned in the detection area of a mark detection system (alignment system) It is desirable for the movement time of the wafer for alignment to be short in order to improve the throughput, and conventionally, the movement path of the wafer was decided from the viewpoint of minimizing the total moving distance of the wafer.

However, the wafer is normally mounted on a wafer stage (biaxial-driven wafer stage) that can be driven in two axis directions that are orthogonal. In the case of such a biaxial-driven wafer stage, the movement time required for the same distance is mostly different depending on the direction in which the stage is driven. Therefore, the movement path of the wafer that has a short moving distance in total does not always necessarily match the path with a short movement time. This is because when the drive units of the two axis directions are driven simultaneously in the case of the biaxial-driven wafer stage, the sum of the drive vector decides the drive distance of the stage. Accordingly, the distance that is driven in the same period of time differs in the movement paths when only one drive unit in one axis direction is used and when both drive units are simultaneously used in the two axis directions.

In addition, recently, an exposure apparatus equipped with a stage unit using a biaxial-driven linear motor method has been proposed (for example, refer to, Japanese Patent Application Laid-open No. 2000-77301). The main focus of the proposal is to reduce the time required for step movement in between shot areas in steppers or scanning steppers, and in such an apparatus the drive axis direction is to be inclined in two axis directions, with respect to the stepping directions in between shot areas in the stepper or to the scanning and non-scanning directions in the scanning stepper.

According to the invention disclosed in the above Japanese Patent Application Laid-open No. 2000-77301, by reducing the time required for step movement in between shot areas, there is an advantage of improving the throughput. However, in the case of the exposure apparatus disclosed in the publication, for example, when considering the case of setting the stepping direction in a direction inclined at 45 degrees to a first axis direction and a second axis direction, the positional measurement error becomes $2^{1/2}$ times while the time required for step movement is reduced to $\frac{1}{2}^{1/2}$. This shows that the possibility of not being able to achieve stage movement with high precision is inherent in the case of such an apparatus.

SUMMARY OF THE INVENTION

The present invention was made under the circumstances described above, and according to the first aspect, it is a movement method in which a moving body is moved using a first drive unit and a second drive unit that generate a drive force in a first axis direction and a second axis direction perpendicular to the first axis direction, respectively, the movement method including a step of: moving the moving body along a specific path among a plurality of paths that start from a first position, pass through a plurality of points noncollinear with the first position, and reach a second position noncollinear with the plurality of points, the specific path having the minimum time required for movement when a component with a longer movement time of the first axis direction and the second axis direction for each path interval are added up.

In this case, 'path interval' means each of the intervals in each path from the first position (starting point) to the second position (end point): between the first position and the first passing point; between adjacent passing points; and between the last passing point and the second position, or to each of the linear intervals in each of the paths described above. In the description, the term 'path interval' is used in such a sense.

In addition, the first position and the second position may be different positions (points), as a matter of course. However, the first position and the second position can be the same position (point).

According to the method, when moving the moving body from the first position while passing through a plurality of points that are noncollinear with the first position to the second position, which is also noncollinear with the plurality of points, the moving body is moved along a specific path that has the minimum time required for movement when a component with a longer movement time of the first axis direction and the second axis direction for each path interval are added up among a plurality of paths. In this case, 'time required for movement' of 'a component with a longer movement time of the first axis direction and the second axis direction for each path interval' means the time required for movement of the axis direction component, which serves as the determining condition, in the case when both the first and second drive units simultaneously drive the moving body. The specific path that has the minimum sum of such a movement time is obviously the path that has the shortest movement time. Accordingly, with the movement method of the present invention, the time required for movement of the moving body from the first position to the second position can be reduced without fail.

In this case, the specific path can be a path that has a minimum standstill time for the first and second drive units among the plurality of paths. In such a case, the moving body is moved along a path whose standstill time of the first and second drive units that drive the moving body in the first axis direction and the second axis direction orthogonal to the first axis direction, respectively, is minimum. More specifically, the time that the first and second drive units both simultaneously drive the moving body is increased as much as possible, and during the time of the synchronous drive, the movement distance of the moving body per unit time can be made longer when compared with the case of driving the moving body using only one of the drive units. As a result, the time required for movement of the moving body from the first position to the second position can be reduced without fail.

In the movement method of the present invention, the moving body can be moved from the first position to the second position, passing through a plurality of points that include at least three noncollinear points.

In this case, at least some points including the at least three noncollinear points can be set to a positional relation that correspond to a positional relation of a plurality of reference points arranged on the moving body among the plurality of points, and the specific path can be set so that each of the plurality of reference points pass through a predetermined point during the movement.

In this case, the plurality of reference points can be arranged on an object mounted on the moving body.

In the movement method of the present invention, in the case the moving body is moved from the first position to the second position passing through a plurality of points that include at least three noncollinear points, the plurality of points can all be set in a positional relation that correspond to a positional relation of a plurality of reference points arranged on the moving body, and the specific path can be set so that the plurality of reference points sequentially pass through a predetermined point during the movement.

In this case, the plurality of reference points can be arranged on an object mounted on the moving body.

In the movement method of the present invention, in the case the specific path is set so that the plurality of reference points each pass through a predetermined point during the movement, the specific path can be decided based on a positional relation between the first position and the predetermined point, a positional relation in the plurality of reference points, a positional relation between the predetermined point and the second position, and at least one of maximum speed and maximum acceleration of the moving body by the first and second drive units. In addition, in the case the predetermined point is a position of a mark detection system used to detect marks formed on the moving body, the plurality of reference points can include a reference point of at least three specific marks formed on an object mounted on the moving body.

In this case, at least the three specific marks can be alignment marks used to adjust a positional relation of the object and the second position. In addition, after the plurality of reference points each pass through the predetermined point, a plurality of areas on the object can each be set as the second position according to detection results of the specific marks by the mark detection system.

According to the second aspect of the present invention, the invention is a first exposure method in which a predetermined pattern is transferred onto each of a plurality of divided areas on an object, the exposure method including: a detection step in which a moving body mounted on the object is moved by a movement method of the present invention, and at least three specific marks on the object are sequentially detected using the mark detection system; and a movement step in which the moving body is moved based on detection results of the mark detection system so as to set the plurality of divided areas to the second position where the pattern is transferred.

With this method, the moving body on which the object is mounted is moved by the movement method of the present invention, and during the movement, at least three specific marks on the object are sequentially detected using the mark detection system. In this case, by setting the waiting position (or a loading position of the object onto the moving body) of the specific marks before the beginning of detection as the first position while setting the exposure position where the pattern is transferred as the second position, for example, then the total movement time of the object from the waiting position to the exposure position when detecting the plurality of specific marks with the mark detection system is reduced without fail.

Then, the moving body is moved based on detection results of the mark detection system so that the plurality of divided areas are set to the second position where the pattern is transferred, and the pattern is sequentially transferred onto the plurality of divided areas on the object. Accordingly, with the first exposure method of the present invention, the time required for mark detection can be reduced, which makes it possible to reduce the total time required for the series of exposure operations.

In this case, in the detection step, the specific mark can be selected from a plurality of alignment marks arranged corresponding to the plurality of divided areas on the object, and in the movement step, information for setting the plurality of divided areas on the object to the second position can be calculated, based on detection results of the specific marks detected by the mark detection system and positional information of the moving body obtained on detection of each specific mark, and the exposure method can further include: a step in which the object is moved via the moving body based on the calculated information so as to transfer the pattern onto each of the plurality of divided areas.

In this case, the information can be array coordinates of a plurality of divided areas on the object in a reference coordinate system that sets the movement of the moving body.

According to the third aspect of the present invention, the invention is a second exposure method in which a mask and an object are synchronously moved along a predetermined scanning direction to transfer a pattern formed on the mask onto the object, the exposure method including a step of: measuring positional information of a moving body where the object is mounted relative to the scanning direction with the scanning direction serving as a measurement axis direction, and driving the moving body synchronously with the mask in the scanning direction via the first and second drive units that respectively generate a drive force in a first axis direction and a second axis direction each intersecting the scanning direction.

With this method, the first and second drive units simultaneously drive the moving body in the scanning direction on scanning exposure, therefore, the moving body can be driven within a shorter period of time when compared with the case when a single drive unit with the same drive performance is used to drive the moving body in the scanning direction. On the other hand, in the case the time required for driving the moving body on scanning exposure is to be set around the same period as when the single drive unit is used, the drive performance of each drive unit can be lowered. In addition, because the positional information related to the scanning direction of the moving body on which the object is mounted is measured with the scanning direction serving as the measurement axis direction, the measurement error of the position of the moving body on scanning exposure can be made smaller compared with when the first axis direction and the second axis direction serve as the measurement axis direction. Accordingly, the synchronous accuracy of the mask and the object can be increased, which allows exposure with a better overlay accuracy.

According to the fourth aspect of the present invention, the invention is a first exposure apparatus that transfers a predetermined pattern onto each of a plurality of divided areas on an object, the exposure apparatus comprising: a moving body on which the object is mounted; a first drive unit that drives the moving body in a first axis direction; a second drive unit that drives the moving body in a second axis direction orthogonal to the first axis direction; a mark detection system that detects marks formed on the moving body; a processing unit that sequentially detects each of a specific mark using the detection system while controlling the first and second drive units, so that the moving body is moved along a specific path that has the minimum time required for movement when a component with a longer movement time of the first axis direction and the second axis direction for each path interval are added up, out of a plurality of paths where at least three specific marks that are noncollinear with the object are sequentially moved to a detection position of the detection system while moving from a first position to a second position where the pattern is transferred; and a control unit that controls the first and second drive units based on detection results of the mark detection system so as to set each of the plurality of divided areas on the object at the second position.

With the exposure apparatus, the processing unit sequentially detects each of the specific marks using the detection system while controlling the first and second drive units, so that the moving body is moved along the specific path that has the minimum time required for movement when the component with a longer movement time of the first axis direction and the second axis direction for each path interval are added up, out of a plurality of paths where at least three specific marks that are noncollinear with the object are sequentially moved to the detection position of the detection system while moving from the first position to the second position where the pattern is transferred. In this case, 'time required for movement' of 'a component with a longer movement time of the first axis direction and the second axis direction for each path interval' refers to the axis direction component that serves as the determining condition in the case when both the first and second drive units simultaneously drive the moving body. The specific path that has the minimum sum of the axis direction components is obviously the path that has the shortest movement time. Accordingly, by moving the moving body along the specific path described above, each specific mark can be sequentially detected using the mark detection system while the moving body is moved in the shortest movement time.

Then, the first and second drive units are controlled by the control unit based on detection results of the mark detection system, so as to set each of the plurality of divided areas on the object at the second position where the pattern transfer is performed. Accordingly, the moving body is moved based on the detection results of the mark detection system so that the plurality of divided areas on the object are each set at the second position, and then the pattern is sequentially transferred onto the plurality of divided areas on the object. Therefore, according to the first exposure apparatus of the present invention, the time required for mark detection can be reduced, which makes it possible to reduce the total time required for the series of exposure operations, which consequently makes it possible to improve the throughput.

According to the fifth aspect of the present invention, the invention is a second exposure apparatus that moves a mask and an object synchronously in a predetermined scanning direction, and transfers a pattern formed on the mask onto the object, the exposure apparatus comprising: a moving body on which the object is mounted; a first drive unit and a second drive unit that drive the moving body in a first axis direction and a second axis direction, respectively, the first axis direction and the second axis direction each intersecting the scanning direction; and a position measurement unit that measures positional information of the moving body relative to the scanning direction, with the scanning direction serving as a measurement axis direction.

With the exposure apparatus, the moving body on which the object is mounted is driven in the first axis direction by the first drive unit and in the second axis direction by the second drive unit. Meanwhile, the positional information of the moving body relative to the scanning direction is measured using the position measurement unit, with the scanning direction serving as the measurement axis direction. Accordingly, for example, by driving the moving body in the scanning direction with the simultaneous drive of the first and second drive units on scanning exposure, the moving body can be driven in a shorter period of time than when the moving body is driven using a single drive unit with the same drive performance whose drive axis direction is the scanning direction. On the other hand, in the case the time required for driving the moving body on scanning exposure is to be set around the same period as when the single drive unit is used, the drive performance of each drive unit can be lowered. In addition, because the scanning direction serves as the measurement axis direction in the position measurement unit, the measurement error of the position of the moving body on scanning exposure can be made smaller compared with when the first axis direction and the second axis direction serve as the measurement axis direction. Accordingly, the synchronous accuracy of the mask and the object can be increased, which allows exposure with a better overlay accuracy.

In this case, the first axis direction and the second axis direction can be set at an angle of 45° with respect to the scanning direction. In addition, the position measurement unit can be a light wave interference type length measuring instrument that irradiates a length measurement beam on a reflection surface arranged on the moving body and measures positional information relative to the scanning direction of the moving body by receiving reflected light from the reflection surface.

In the lithography process, by transferring the pattern onto the object using either the first exposure method or the first exposure apparatus of the present invention, from the aspect of improving throughput, the productivity of the devices serving as end products can be improved. Accordingly, further from another aspect, it can be said that the present invention is a device manufacturing method that uses either the first exposure method or the first exposure apparatus of the present invention.

In addition, in the lithography process, by transferring the pattern onto the object using either the second exposure method or the second exposure apparatus of the present invention, from the aspect of improving yield, the productivity of the devices serving as end products can be improved. Accordingly, further from another aspect, it can be said that the present invention is a device manufacturing method that uses either the second exposure method or the second exposure apparatus of the present invention.

BRIEF DESCRIPTION OF THE DRAWINGS

In the accompanying drawings;

FIG. 6A is a view of a movement track of a wafer in the case a sample mark $M_{12}$ closer to the sixth sample mark is selected as the seventh sample mark and a sample mark $M_{13}$ is selected as the eighth sample mark, while

DESCRIPTION OF THE EMBODIMENTS

A First Embodiment

A first embodiment of the present invention is described below, referring to FIGS. 1 to 7.

Figure 1:
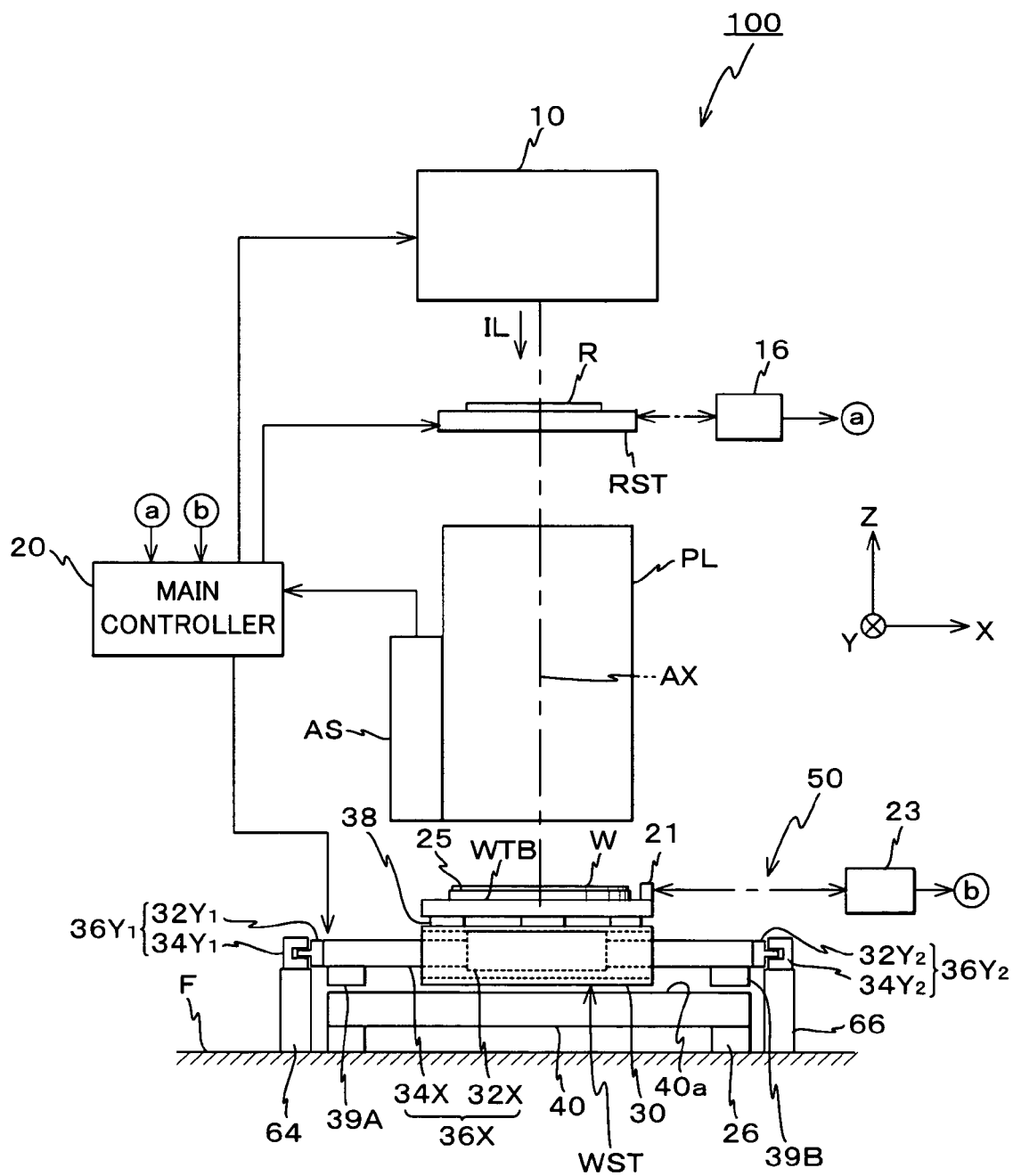
FIG. 1 is a schematic view of a configuration of an exposure apparatus related to a first embodiment of the present invention.

FIG. 1 shows an entire configuration of an exposure apparatus 100 related to the first embodiment. Exposure apparatus 100 is a projection exposure apparatus (the so-called scanning stepper) of a step-and-scan method. Exposure apparatus 100 is equipped with: an illumination system 10; a reticle stage RST that holds a reticle R serving as a mask; a projection optical system PL; a stage unit 50 that incorporates a wafer stage WST serving as a moving body on which a wafer W serving as an object is mounted; a control system for the above parts; and the like.

Illumination system 10 includes a light source and an illumination optical system, and a rectangular shaped or an arc-shaped illumination area set by an aperture stop (also referred to as a masking blade or a reticle blind) disposed inside the system is irradiated with an illumination light IL serving as an energy beam, so as to evenly illuminate reticle R on which a circuit pattern is formed. An illumination system similar to illumination system 10 is disclosed in, for example, Japanese Patent Application Laid-Open No. 06-349701 and its corresponding U.S. Pat. No. 5,534,970. As long as the national laws in designated states (or elected states), to which this international application is applied, permit, the above disclosures of the publication and the corresponding U.S. patent are incorporated herein by reference.

As illumination light IL, far ultraviolet light such as the KrF excimer laser beam (wavelength 248 nm), vacuum ultraviolet light such as the ArF excimer laser beam (wavelength 193 nm) or the $F_2$ laser (wavelength. 157 nm), or the like is used. It is also possible to use bright lines in the ultraviolet region generated by an ultra high-pressure mercury lamp (such as the g-line or the i-line) as illumination light IL.

On reticle stage RST, reticle R is fixed by, e.g. electrostatic chucking, vacuum chucking, or the like. Reticle stage RST is structured so that it can be finely driven (includes rotation around a Z-axis (θz rotation)) within an XY plane, which is perpendicular to the optical axis of illumination system 10 (coincides with optical axis AX of projection optical system PL described later) by a reticle stage drive section (not shown) that includes linear motors, voice coil motors, and the like. Reticle stage RST can also be driven in a predetermined scanning direction (in this case, a Y-axis direction, which is a direction orthogonal to the page surface of FIG. 1) at a designated scanning speed.

The position (including θz rotation) of reticle stage RST within the XY plane is constantly detected by a reticle laser interferometer (hereinafter referred to as 'reticle interferometer') 16, which irradiates a laser beam on a reflection surface formed in a part of reticle stage RST or arranged on the stage, at a resolution around, for example, 0.5 to 1 nm.

The positional information of reticle stage RST from reticle interferometer 16 is supplied to a main controller 20.

Based on the positional information of reticle stage RST, main controller 20 controls and drives reticle stage RST via the reticle stage drive section (not shown).

Projection optical system PL is disposed below reticle stage RST, as in FIG. 1, and the direction of optical axis AX of projection optical system PL is to be the Z-axis direction. As projection optical system PL, for example, a both-side telecentric dioptric system is used that has a predetermined projection magnification β (β is, for example, ¼ or ⅕). Therefore, when illumination light IL from illumination system 10 illuminates the illumination area on reticle R, illumination light IL that has passed through reticle R forms a reduced image of the circuit pattern within the illumination area on reticle R (a partial inverted image of the circuit pattern) on wafer W whose surface is coated with a resist (photosensitive agent), via projection optical system PL.

Stage unit 50 is equipped with: a stage base 40, which is supported substantially horizontal on a floor surface (or a base plate or a frame caster) F via a plurality (e.g. three or four) of vibration isolation units 26; wafer stage WST disposed above stage base 40; and a wafer stage drive section that drives wafer stage WST.

Vibration isolation units 26 each isolate fine vibration traveling from floor surface F to stage base 40 at a micro-G level, respectively. As these vibration isolation units 26, it is a matter of course that the so-called active vibration isolation units, which proactively suppress vibration of stage base 40 based on the output data of vibration sensors such as semiconductor accelerometers, can be used.

The +Z surface (the upper surface) of stage base 40 is processed to have an extremely high flatness degree. The +Z surface is a guide surface 40a, which is a movement reference surface of wafer stage WST.

Wafer stage WST is driven by the wafer stage drive section described later below projection optical system PL in FIG. 1. Wafer stage WST holds wafer W and performs an XY two-dimensional movement along guide surface 40a.

Wafer stage WST is equipped with a wafer stage main body 30, and a wafer table WTB that is mounted on wafer stage main body 30 via a Z-tilt drive mechanism 38. On the upper surface of wafer table WTB, wafer W is held by vacuum suction (or electrostatic suction) or the like via a wafer holder 25.

Wafer stage main body 30 consists of a rough rectangular-solid-shaped member that has an opening communicating in an X-axis direction. On the lower surface of wafer stage main body 30, a plurality (e.g. four) of vacuum preload gas hydrostatic bearings (not shown, hereinafter simply referred to as 'gas hydrostatic bearings') are arranged, and pressurized gas blows out from these gas hydrostatic bearings toward the upper surface (guide surface) 40a of stage base 40. In this case, wafer stage WST is supported by levitation in a noncontact manner above guide surface 40a via a clearance of around several μm, due to the balance between the static pressure of the pressurized gas between the bearing surface of the gas hydrostatic bearings and guide surface 40a (or in other words, pressure within the gap), and the weight of wafer stage WST itself and the force of the vacuum preload.

Figure 2:
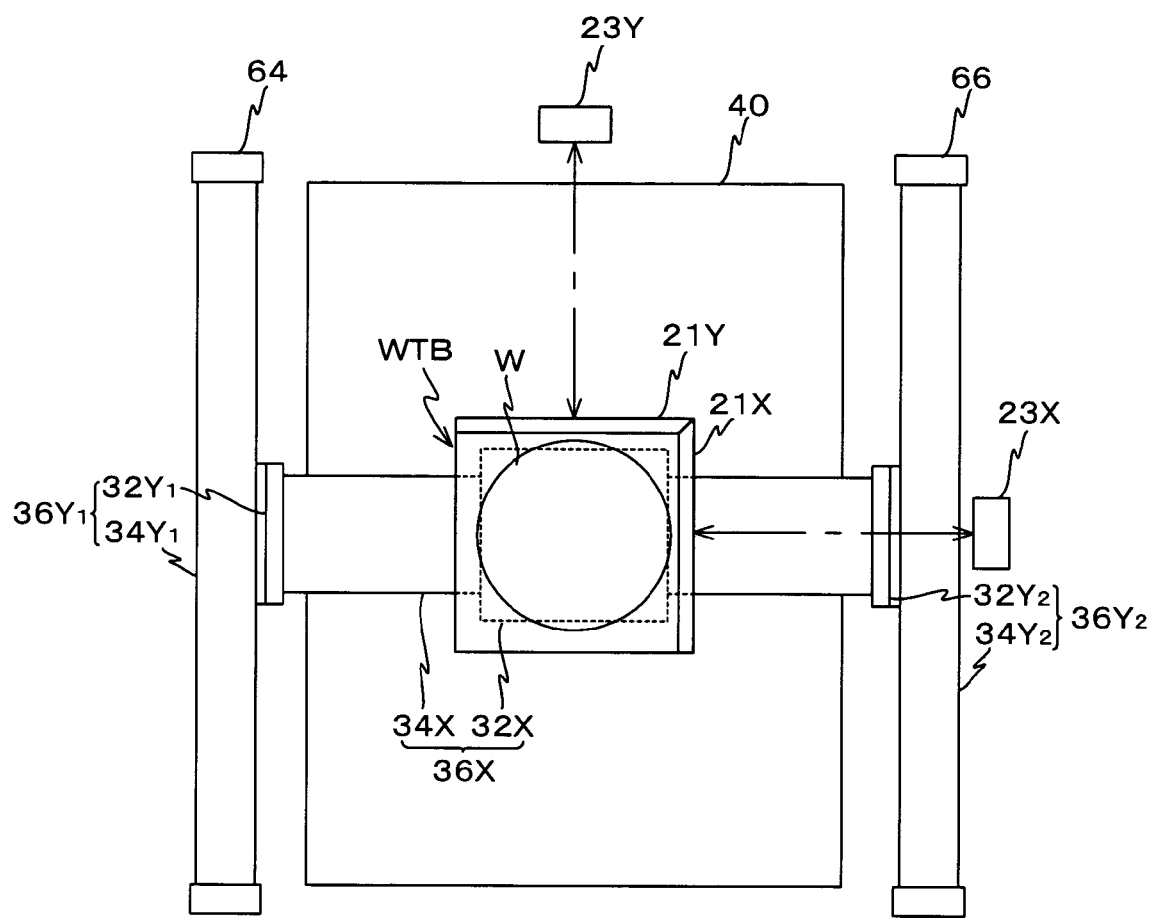
FIG. 2 is a planar view of a configuration of a wafer stage and a wafer stage drive section in FIG. 1.

As is shown in FIGS. 1 and 2, the wafer stage drive section is equipped with an X-axis linear motor 36X, and a pair of Y-axis linear motors $36Y_1$ and $36Y_2$. X-axis linear motor 36X drives wafer stage WST in the X-axis direction, which is the non-scanning direction orthogonal to the scanning direction (Y-axis direction), whereas, Y-axis linear motors $36Y_1$ and $36Y_2$ drive wafer stage WST in the Y-axis direction, which is the scanning direction, integrally with X-axis linear motor 36X.

X-axis linear motor 36X is equipped with an X-axis linear guide 34X serving as a stator whose longitudinal direction is in the X-axis direction, and a X mover 32X that moves in the X-axis direction with wafer stage WST along X-axis linear guide 34X.

X-axis linear guide 34X is equipped with a guide member whose longitudinal direction is in the X-axis direction, a plurality of armature coils disposed in a predetermined spacing along the X-axis direction inside the guide member, and the like. X-axis linear guide 34X is in a state inserted inside wafer stage main body 30 (in the opening formed communicating in the X-axis direction).

X mover 32X is fixed to wafer stage main body 30 in a state where X-axis linear guide 34X is insertable into its inner opening. X mover 32X is equipped with a mover yoke (magnet plate) that has a rectangular-framed sectional shape, extending in the X-axis direction, and a plurality of field magnets consisting of N-pole and S-pole permanent magnets that are alternately disposed at a predetermined spacing along the X-axis direction on the upper and lower opposing inner surfaces of the mover yoke, with each of the permanent magnets opposing X-axis linear guide 34X described above. In this case, the field magnets that are adjacent have an opposite polarity. The field magnets that oppose each other also have an opposite polarity. Accordingly, an alternating magnetic field is formed along the X-axis direction in the inner space of the mover yoke.

Then, X mover 32X and X-axis linear guide 34X, or to be more specific, the electromagnetic force generated by electromagnetic interaction between the alternating magnetic field of the field magnets constituting X mover 32X and an armature unit (current flow through the armature coil) constituting X-axis linear guide 34X, moves wafer stage WST in the X-axis direction along X-axis linear guide 34X. That is, mover 32X and X-axis linear guide 34X constitute X-axis linear motor 36X, which is a moving magnet type electromagnetically driven linear motor, and X-axis linear motor 36X constitutes a first drive unit, which drives wafer stage WST in the X-axis direction (a first axis direction).

On the lower surface of X-axis linear guide 34X close to both of the ends in the longitudinal direction, gas hydrostatic bearings 39A and 39B are arranged, respectively. Pressurized gas blows out from gas hydrostatic bearings 39A and 39B toward the upper surface (guide surface) 40a of stage base 40, and as in the case of wafer stage main body 30 described earlier, X-axis linear guide 34X is supported by levitation above guide surface 40a in a noncontact manner by the static pressure of the pressurized gas between the bearing surface of gas hydrostatic bearings 39A and 39B and guide surface 40a (or in other words, pressure within the gap). In this case, a clearance (bearing gap) of around several μm is maintained between the bearing surface of gas hydrostatic bearings 39A and 39B and guide surface 40a.

As is shown in FIGS. 1 and 2, one of the Y-axis linear motors, Y-axis linear motor $36Y_1$, is equipped with a Y mover $32Y_1$, which is fixed to one end (−X end) of X-axis linear guide 34X in the longitudinal direction, and a Y-axis linear guide $34Y_1$, which has a sectional shape of a letter U in an XZ plane where Y mover $32Y_1$ is inserted.

Y mover $32Y_1$ has a sectional shape of a letter T in the XZ plane, and inside Y mover $32Y_1$, armature coils (not shown) are disposed in the Y-axis direction at a predetermined interval (predetermined pitch).

As is with X mover 32X described earlier, on a pair of opposing surfaces (upper and lower opposing surface) inside Y-axis linear guide 34Y$_1$, a plurality of field magnets (not shown) are disposed in the Y-axis direction at a predetermined interval. Y-axis linear guide 34Y$_1$ is held in the longitudinal direction near both ends, by two support members 64 fixed on floor surface F on the −X side of stage base 40, respectively.

As is described, in the embodiment, Y mover 32$_1$ and Y-axis linear guide 34Y$_1$ constitute Y-axis linear motor 36Y$_1$, which is a moving magnet type electro-magnetically driven linear motor.

The other Y-axis linear motor, Y-axis linear motor 36Y$_2$, is composed including a Y-axis linear guide 34Y$_2$, which extends in the Y-axis direction above floor surface F on the +X side of stage base 40, and a Y mover 32Y$_2$, which is fixed to the other end (+X end) of X-axis linear guide 34X in the longitudinal direction, and is also inserted into Y-axis linear guide 34Y$_2$.

Y-axis linear guide 34Y$_2$ is composed in the same manner as Y-axis linear guide 34Y$_1$ described earlier, and two support members 66 hold both ends of Y-axis linear guide 34Y$_2$ in the vicinity in the longitudinal direction, respectively. Y mover 32Y$_2$ is also composed in the same manner as Y mover 32Y$_1$ described earlier.

Also in this case, Y mover 32Y$_2$ and Y-axis linear guide 34Y$_2$ constitute Y-axis linear motor 36Y$_2$, which is a moving magnet type electro-magnetically driven linear motor.

Referring back in the description, gas hydrostatic bearings (not shown) are arranged in between the surfaces of X-axis linear guide 34X on the +Y and −Y sides and wafer stage main body 30 that faces the surfaces, respectively. The static pressures of the pressurized gases of the gas hydrostatic bearings are balanced so that the relative positional relation of wafer stage main body 30 and X-axis linear guide 34X in the Y-axis direction is maintained in a constant state. Therefore, when Y-axis linear motors 36Y$_1$ and 36Y$_2$ generate a drive force (Lorentz force) in the Y-axis direction, X-axis linear guide 34X is driven in the Y-axis direction, and by the drive force, wafer stage WST is also to be driven in the Y-axis direction along with X-axis linear guide 34X. That is, in the embodiment, the pair of Y-axis linear motors 36Y$_1$ and 36Y$_2$ constitutes a second drive unit that drives wafer stage WST in the Y-axis direction (a second axis direction).

Z-tilt drive mechanism 38 is composed including three actuators (such as voice coil motors or EI cores) that support wafer table WTB at three points on wafer stage main body 30. Z-tilt drive mechanism 38 drives wafer table WTB finely in directions of three degrees of freedom; in the Z-axis, $\theta x$ (rotation direction around the X-axis), and $\theta y$ (rotation direction around the Y-axis) directions.

As is shown in FIG. 1, on the edge of the upper surface of wafer table WTB, a movable mirror 21 is fixed, on which a laser beam from a wafer laser interferometer (hereinafter referred to as a 'wafer interferometer') 23 serving as a position measuring unit (light wave interference type length measuring instrument) is irradiated. And from wafer interferometer 23 externally disposed, the position of wafer table WTB within the XY plane (including the $\theta z$ rotation) is detected constantly, at a resolution of, e.g. around 0.5 to 1 nm, based on the light reflected off movable mirror 21.

On the upper surface of wafer table WTB, in actual, a movable mirror 21X that has a reflection surface orthogonal to the X-axis direction is arranged close to the edge on the +X side, whereas a movable mirror 21Y that has a reflection surface orthogonal to the Y-axis direction is arranged close to the edge on the +Y side, as is shown in FIG. 2. In addition, corresponding to these mirrors, an X-axis interferometer 23X and a Y-axis interferometer 23Y are arranged for measuring the position of wafer table WTB in the X-axis direction and the Y-axis direction, respectively, by irradiating laser beams onto movable mirrors 21X and 21Y. In the embodiment, X-axis interferometer 23X and Y-axis interferometer 23Y are both multi-axis interferometers that have a plurality of length measurement axes, and in addition to the rotation amount (yawing amount) of wafer table WTB in the $\theta z$ direction, the rotation amount (pitching amount) in the $\theta x$ direction and the rotation amount (rolling amount) in the $\theta y$ direction can also be detected. Accordingly, a plurality of wafer interferometers and movable mirrors are arranged as is described above, however, in FIG. 1, these are representatively shown as movable mirror 21 and wafer interferometer 23.

Instead of providing movable mirror 21X and 21Y, for example, the edge surface of wafer table WTB may be mirror polished so as to form a reflection surface (corresponding to the reflection surface of movable mirrors 21X and 21Y). In addition, the multi-axis interferometers may detect the positional information relative to the optical axis direction (Z-axis direction) of projection optical system PL by irradiating laser beams on a reflection surface arranged on a frame (not shown) on which projection optical system PL is mounted via a reflection surface arranged on wafer table WTB inclined at an angle of 45°. In this case, the positional relation relative to the Z-axis direction may be detected at a plurality of points within the XY plane, and the inclination information relative to the XY plane may also be obtained in addition to the positional information of wafer table WTB in the Z-axis direction. Furthermore, wafer stage WST may be configured so that wafer table WTB is finely drivable in directions of six degrees of freedom, additionally in the X-axis, Y-axis, and $\theta z$ directions.

The positional information (and velocity information) of wafer table WTB measured by wafer interferometer 23 is sent to main controller 20 in FIG. 1, and based on the information, main controller 20 controls the position of wafer stage WST via linear motors 36X, 36Y$_1$, and 36Y$_2$ that compose the wafer stage drive section previously described.

As is shown in FIG. 1, on the side surface of projection optical system PL, an alignment detection system AS is arranged, which serves as a mark detection system by the off-axis method. As alignment detection system AS, an FIA (Field Image Alignment) system is used. Details on such a system are disclosed in, for example, Japanese Patent Application Laid-Open No. 02-54103 and its corresponding U.S. Pat. No. 4,962,318, and the like. Alignment detection system AS irradiates an illumination light (such as white light) that has a predetermined wavelength width on a wafer, forms an image of an alignment mark serving as a positioning mark on the wafer and an image of an index mark on an index plate disposed on a plane conjugate with the wafer by an objective lens or the like on the light receiving surface of a pick-up device (such as a CCD camera), and then performs detection. Then, alignment detection system AS outputs the imaging results of the marks subject to detection to main controller 20. As long as the national laws in designated states (or elected states), to which this international application is applied, permit, the above disclosures of the publication and the corresponding U.S. patent are incorporated herein by reference.

The alignment detection system is not limited to the FIA system, and an alignment sensor may also be used that irradiates a laser beam on a grating mark on a wafer from a predetermined direction (for example, a perpendicular direction), and detects the interference beams of the diffracted lights of the same order ($\pm n^{th}$ order diffracted light) generated from the grating mark.

Furthermore, in exposure apparatus 100 in the embodiment, the position of wafer W in the +Z direction and the inclination relative to the XY plane are measured by a focus sensor (omitted in drawings) that consists of a multiple focal point position detection system, which details are disclosed in, for example, Japanese Patent Application Laid-Open No. 06-283403 and its corresponding U.S. Pat. No. 5,448,332. The output of the focus sensor is supplied to main controller 20, and main controller 20 controls wafer stage WST and performs the so-called focus leveling control. The detection points (irradiation points of the image-forming beams) of the focus sensor may be located only in the exposure area described earlier, or the detection points may be located in the exposure area and also on both sides in the scanning direction. In addition, the image made by the image-forming beams is not limited to a pinhole image or a slit image, and an image of a predetermined shape (e.g. a parallelogram) that has a certain amount of area may be formed. As long as the national laws in designated states (or elected states), to which this international application is applied, permit, the above disclosures of the publication and the corresponding U.S. patent are incorporated herein by reference.

The control system is mainly composed of main controller 20. Main controller 20 is configured including the so-called microcomputer (or workstation) that consists of a CPU (Central Processing Unit), a ROM (Read Only Memory), a RAM (Random Access Memory), and the like, and main controller 20 controls the overall operation of the entire apparatus. Main controller 20 has control over operations such as, synchronous scanning of reticle R (reticle stage RST) and wafer W (wafer stage WST), step movement operation of wafer W (wafer stage WST) in between shots, and the like, so that the exposure operation is accurately performed.

In exposure apparatus 100 of the embodiment, as in a typical scanning stepper, after predetermined preparatory operations are performed such as wafer exchange (or wafer loading) at a wafer exchange position; reticle alignment and baseline measurement of alignment detection system AS; wafer alignment by the EGA (Enhanced Global Alignment) described later; and the like, exposure operation by the step-and-scan method is performed. Thus, the circuit pattern of reticle R is transferred onto the plurality of shot areas on wafer W.

During scanning exposure of each shot area on wafer W, because exposure has to be performed in a state where the surface of wafer W substantially coincides with the image-forming plane of projection optical system PL within the illumination area (exposure area previously described) of illumination light IL on wafer W, main controller 20 performs auto-focusing and auto-leveling based on the output of the focus sensor.

Next, wafer alignment by the EGA method employed in the embodiment will be briefly described.

In the EGA method, positional information such as the position coordinates is measured for a plurality of shot areas (three or more, normally around seven to fifteen) that are selected in advance as specific shot areas of a wafer. Then, using the measurement values, statistical calculation (the least squares method or the like) is performed to calculate the positional information (e.g. array coordinates of the shot areas) of all the shot areas on wafer W. After the calculation is complete, the wafer stage is sequentially moved to a predetermined reference position, according to the calculated array coordinates of the shot areas. With this EGA method, the measurement time is short, and there is also an advantage of being able to expect an averaging effect to random measurement errors.

A simple description will be made on the statistical processing method executed in the EGA method. On describing the method, when the design array coordinates of m ($m \geq 3$) specific shot areas (also referred to as 'sample shot areas' or 'alignment shot areas') on wafer W are expressed as ($X_n$, $Y_n$) ($n=1, 2, \ldots, m$), a linear model as is shown in equation (1) below can be given for deviation ($\Delta X_n$, $\Delta Y_n$) from the design array coordinates.

$$\begin{pmatrix} \Delta X_n \\ \Delta Y_n \end{pmatrix} = \begin{pmatrix} a & b \\ c & d \end{pmatrix} \begin{pmatrix} X_n \\ Y_n \end{pmatrix} + \begin{pmatrix} e \\ f \end{pmatrix} \quad (1)$$

Furthermore, when deviation (measurement values) of the actual array coordinates of each of the m sample shot areas from the design array coordinates is to be expressed as ($\Delta x_n$, $\Delta y_n$), the sum of squares E of the residual of such deviation and the deviation from the design array coordinates given by the above linear model can be expressed as in equation (2) below.

$$E = \Sigma \{ (\Delta x_n - \Delta X_n)^2 + (\Delta y_n - \Delta Y_n)^2 \} \quad (2)$$

Then, in the EGA method, parameters a, b, c, d, e, and f that minimizes equation (2) are calculated, and based on the calculated parameters a to f and the design array coordinates, array coordinates are calculated for all the shot areas on the wafer. Hereinafter, such a calculation process will be referred to as EGA calculation.

Figure 3:
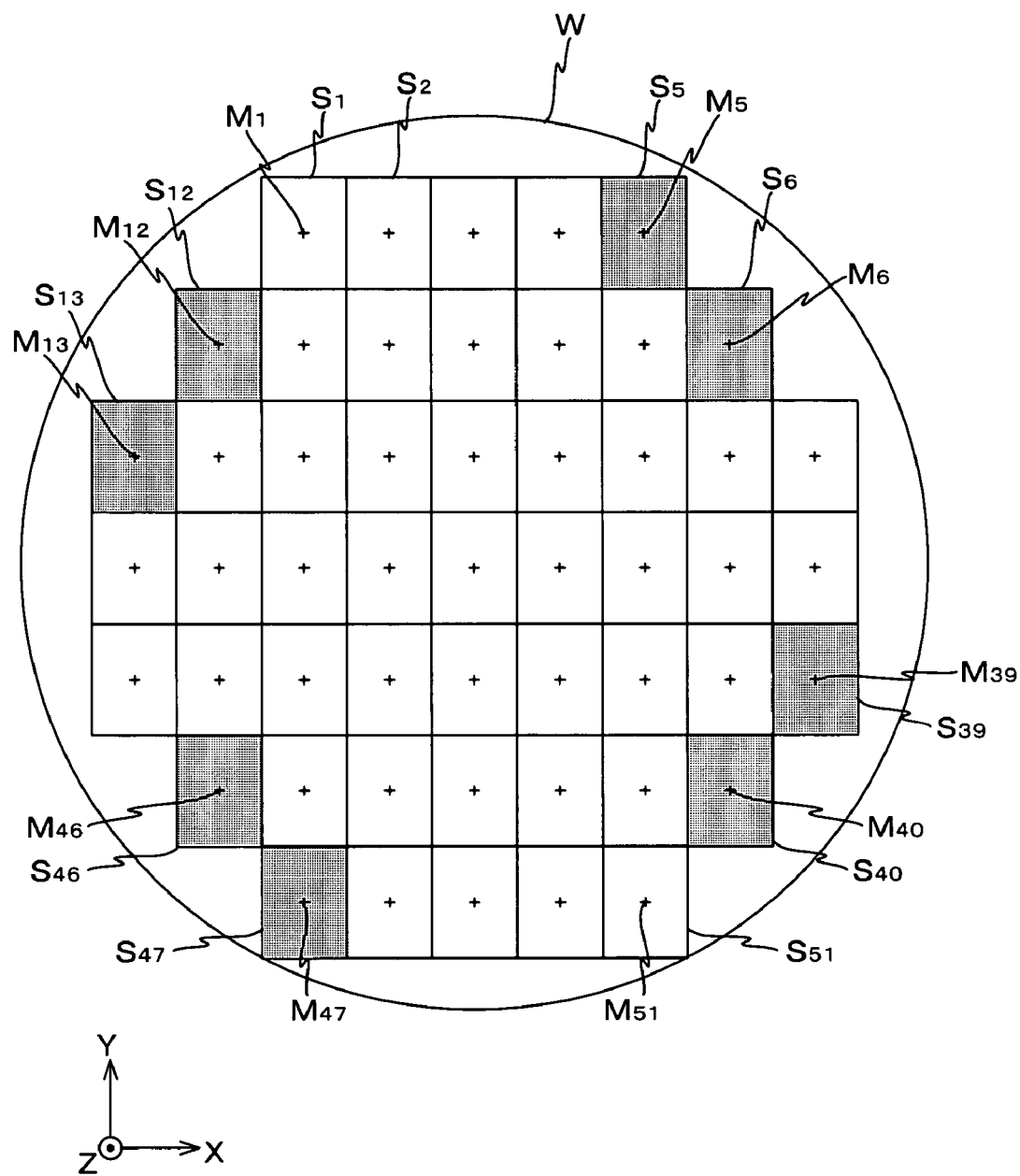
FIG. 3 is a view of shot areas and alignment marks on a wafer.

In the embodiment, as the sample shot areas, as is shown in FIG. 3, among the shot areas ($S_n$(n=1 to 51) serving as a plurality of divided areas formed on wafer W, eight shot areas ($S_5$, $S_6$, $S_{12}$, $S_{13}$, $S_{39}$, $S_{40}$, $S_{46}$, $S_{47}$) located close to the outer edge of the wafer are selected in advance. Then, EGA calculation is to be performed, based on the detection results of positional information on alignment marks (sample marks) serving as positioning marks, which are arranged on the sample shot areas.

More particularly, sample marks ($M_5$, $M_6$, $M_{12}$, $M_{13}$, $M_{39}$, $M_{40}$, $M_{46}$, $M_{47}$) that are arranged on the eight shot areas (sample shot areas, or in other words, alignment shot areas) on wafer W are detected, using alignment detection system AS. Then, position coordinates are obtained for the sample shot areas on the stage coordinate system, based on the detection results and the measurement values of wafer interferometer 23 obtained during the detection of each sample mark. And then, EGA calculation described earlier is performed based on the position coordinates of the sample shot areas that have been obtained and the respective design position coordinates. Accordingly, the six parameters in equation (1) above are calculated, along with the array coordinates for all the shot areas that are calculated based on the calculation results and the design values of the shot areas.

Alignment mark $M_n$ is actually not formed within the shot area, and is formed on street lines between adjacent shot areas or the like. However, for the sake of convenience in the drawings and the description, alignment mark $M_n$ is described as if it is formed in the center of the shot area.

In the embodiment, after wafer exchange has been performed at the wafer exchange position (a first position), a series of operations are performed to sequentially detect the eight sample marks (in this case, wafer table WTB (wafer stage WST) on which wafer W is mounted is moved according to the positional relation and detection order of the sample marks), and to move wafer table WTB (wafer stage WST) on which wafer W is mounted to the exposure starting position.

Figure 4:
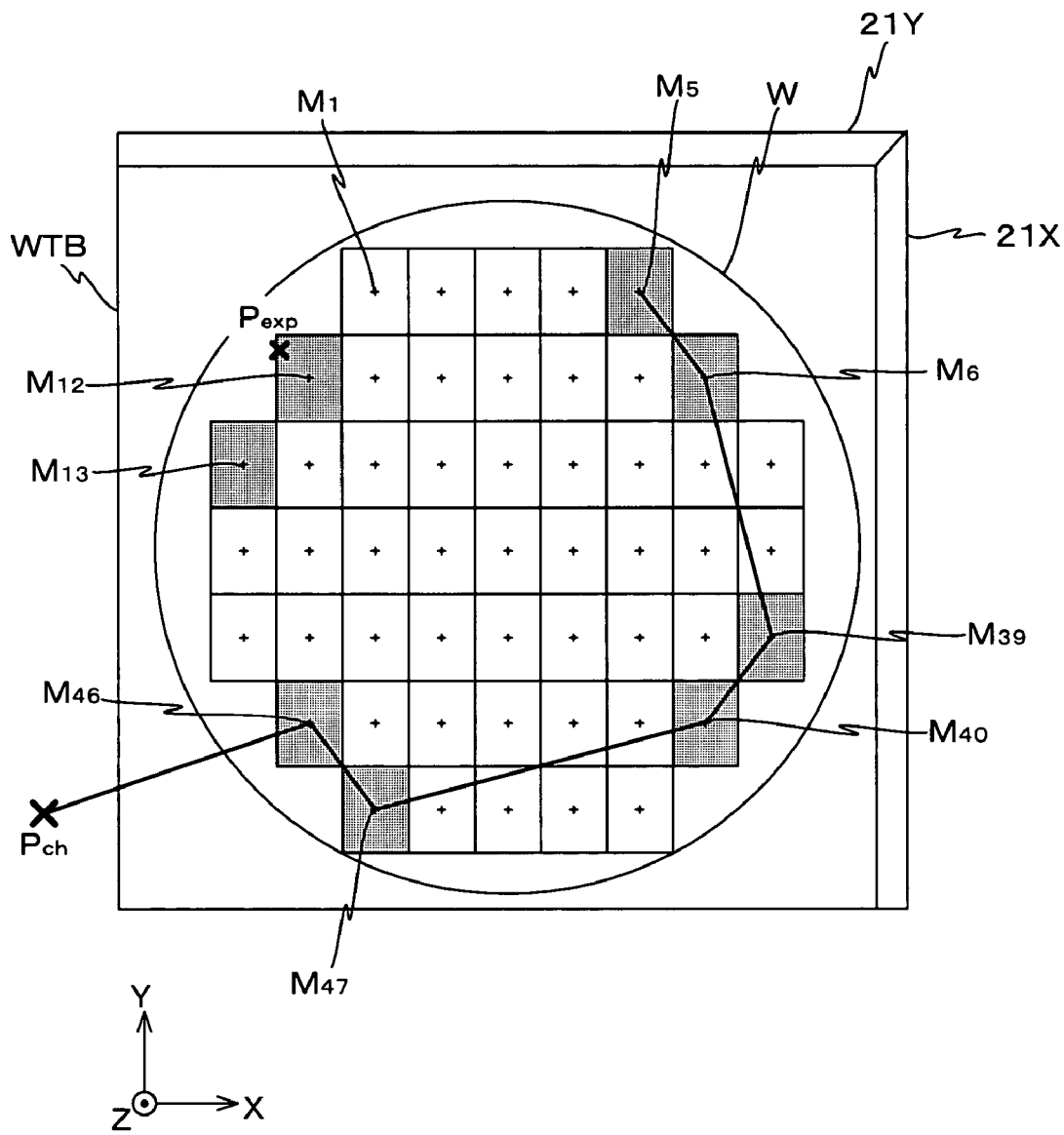
FIG. 4 is a view of a movement track of the detection center of an alignment detection system with respect to a wafer that is used to describe a movement path of a wafer from a wafer exchange position to an exposure starting position while moving through alignment measurement.

FIG. 4 shows the movement track of wafer table WTB (wafer W) when six of the sample marks ($M_{46}$, $M_{47}$, $M_{40}$, $M_{39}$, $M_6$, $M_5$) have been detected on detection of the eight sample marks shown in FIG. 3. However, in FIG. 4, for the sake of a better understanding, FIG. 4 shows the movement track of the detection center of alignment detection system AS that moves relatively to wafer table WTB (wafer W), and wafer table WTB (wafer W) is to be fixed. In FIG. 4, mark $P_{ch}$ shows the position of the detection center of alignment detection system AS when wafer table WTB (wafer stage WST) is at the wafer exchange position. In addition, in FIG. 4, mark $P_{exp}$ shows the position of the detection center of alignment detection system AS when wafer table WTB (wafer stage WST) is at the exposure starting position (a second position).

In the description below, for the sake of convenience, mark $P_{ch}$ will be appropriately expressed as 'wafer exchange position $P_{ch}$,' and mark $P_{exp}$ will be expressed as 'exposure starting position $P_{exp}$.'

Figure 5:
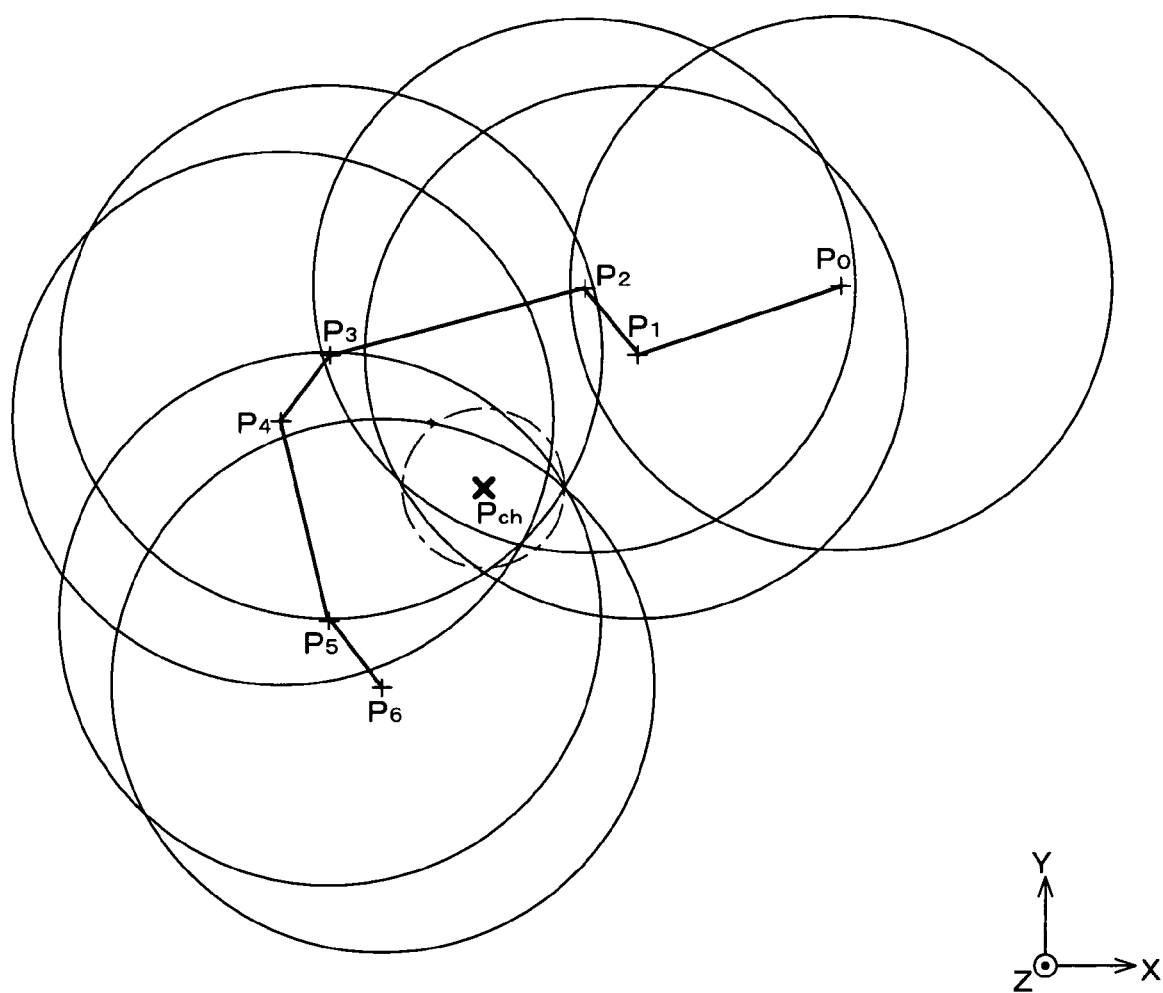
FIG. 5 is a view of a movement track of a wafer that corresponds to the moving track in FIG. 4.

FIG. 5 shows the movement track of wafer W (that is, wafer stage WST) that corresponds to the movement track in FIG. 4. In FIG. 5, the track shown in the broken line shows the track of the center of wafer W. In addition, in FIG. 5, point $P_0$ shows the position of the center of wafer W after wafer exchange whereas mark $P_{ch}$ shows the position of the detection center of alignment detection system AS when wafer stage WST is at the wafer exchange position. Furthermore, points $P_1$, $P_2$, $P_3$, $P_4$, $P_5$, $P_6$ indicate the positions of the center of wafer W when sample marks $M_{46}$, $M_{47}$, $M_{40}$, $M_{39}$, $M_6$, $M_5$ are detected using alignment detection system AS. As is obvious when comparing FIGS. 5 and 4, the positional relation of points $P_1$ to $P_6$ accurately corresponds to the positional relation of sample marks $M_{46}$, $M_{47}$, $M_{40}$, $M_{39}$, $M_6$, and $M_5$.

From the viewpoint of improving the throughput of the entire exposure processing, it is important to decide the movement path of wafer W (wafer stage WST) so that the time wafer W requires from wafer exchange position $P_{ch}$ to exposure starting position $P_{exp}$ is the shortest. The method of deciding the movement path of wafer W on wafer alignment performed in the embodiment is described below, referring to an example.

Figure 6A:
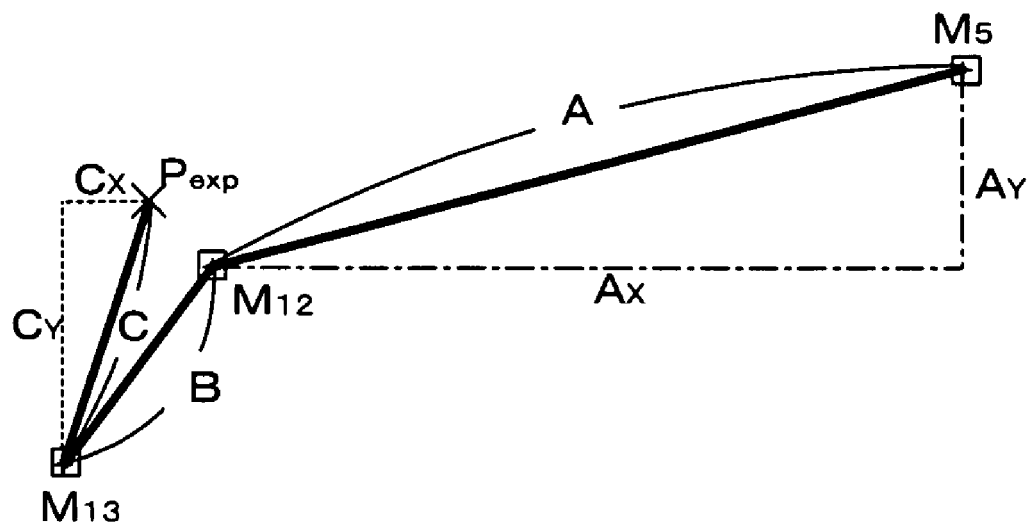
Figure 6B:
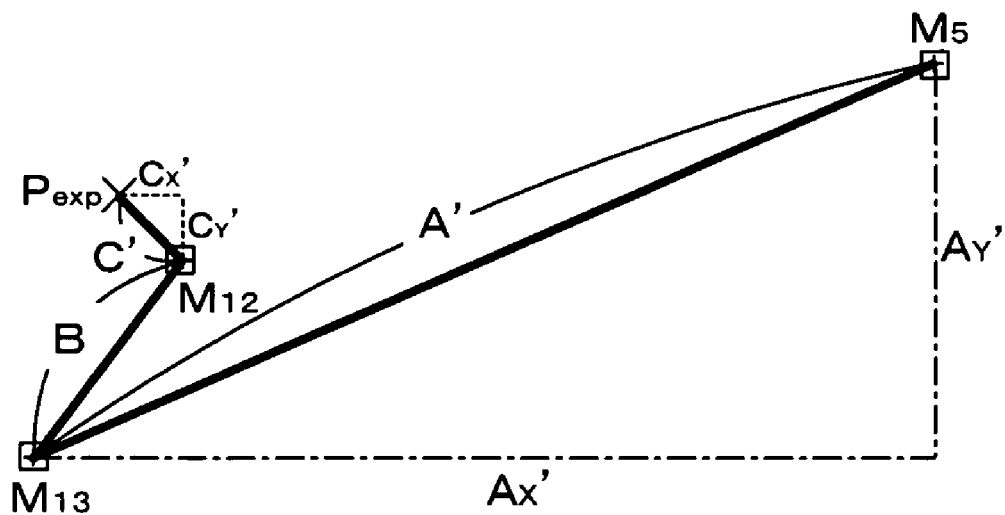
FIG. 6B is a view of a movement track of a wafer in the case the sample mark $M_{13}$ is selected as the seventh sample mark and the sample mark $M_{12}$ is selected as the eighth sample mark.

FIGS. 6A and 6B show drawings for describing a way to decide the path from the $7^{th}$ sample mark ($M_{12}$ or $M_{13}$), the $8^{th}$ sample mark ($M_{13}$ or $M_{12}$), and then to exposure starting position $P_{exp}$ when detecting the eight sample marks as is previously described, in the case detection of the six sample marks ($M_{46}$, $M_{47}$, $M_{40}$, $M_{39}$, $M_6$, $M_5$) have already been completed (refer to FIG. 4).

Of the drawings, FIG. 6A shows the movement path of the wafer in the case when sample mark $M_{12}$, which is closer to the $6^{th}$ sample mark $M_5$, is chosen as the $7^{th}$ sample mark and sample mark $M_{13}$ is chosen as the $8^{th}$ sample mark. On the other hand, FIG. 6B shows the movement path of the wafer in the case when sample mark $M_{13}$ is chosen as the $7^{th}$ sample mark and sample mark $M_{12}$ is chosen as the $8^{th}$ sample mark.

In this case, equation (3) below shows the moving distance when the movement path shown in FIG. 6A is selected, whereas equation (4) below shows the moving distance when the movement path shown in FIG. 6B is selected.

$$A+B+C=(A_X^2+A_Y^2)^{1/2}+B+(C_X^2+C_Y^2)^{1/2} \tag{3}$$

$$A'+B+C'=(A_{X'}^2+A_{Y'}^2)^{1/2}+B+(C_{X'}^2+C_{Y'}^2)^{1/2} \tag{4}$$

As is obvious when comparing FIGS. 6A and 6B, the movement path in FIG. 6B has a longer moving distance. Also in this case, path interval B (the path between marks $M_{12}$ and $M_{13}$) is common in both paths, therefore, equation (5) below stands.

$$(A_X^2+A_Y^2)^{1/2}+(C_X^2+C_Y^2)^{1/2} < (A_{X'}^2+A_{Y'}^2)^{1/2}+(C_{X'}^2+C_{Y'}^2)^{1/2} \tag{5}$$

The term 'movement path' here is actually the relative movement path of the detection center of alignment detection system AS with respect to the wafer, therefore, alignment detection system AS does not move. However, for the sake of convenience in the drawings and the description, FIGS., 4, 6A, and 6B are shown as if alignment detection system AS moves.

Next, the case is described whether to choose either the movement path in FIG. 6A or the movement path in FIG. 6B for a shorter movement time.

As is described earlier, because path interval B is common when choosing either of the paths, in order to compare the time required to move along each path, the time required to move along the following paths should be compared: {path interval A (the path interval between marks $M_5$ and $M_{12}$)+ path interval C (the path interval between mark $M_{13}$ and exposure starting position $P_{exp}$); and {path interval A' (the path interval between marks $M_5$ and $M_{13}$)+path interval C' (the path interval between mark $M_{12}$ and exposure starting position $P_{exp}$).

In this case, in order to simplify the description, the performance (drive thrust and drive speed) of X-axis linear motor 36X and Y-axis linear motors $36Y_1$ and $36Y_2$ is to be the same, and each of the linear motors 36X, $36Y_1$, and $36Y_2$ are to be moved at a constant speed (acceleration time is ignored) Accordingly, for example, when wafer stage WST moves from coordinate (0, 0) to coordinate (a, 0), or from coordinate (0, 0) to coordinate (a, b) (b≦a), the time required for movement is the same (more specifically, the movement in the direction of one axis is concealed in the movement in the direction of the other axis). In this case, the moving distance in the former case turns out to be a, whereas the moving distance is $(a^2+b^2)^{1/2}$ in the latter case, which means that the moving distance can be increased in the latter case in the same period of time.

That is, the time required to move along each path interval is proportional to either the X-direction component (X distance) or the Y-direction component (Y distance) of the path interval, whichever is longer (the component of a longer distance becomes the determining condition).

To be more specific, in the path shown in FIG. 6A, since X component $A_X$ is longer than Y component $A_Y$ in path interval A, X component $A_X$ becomes the determining condition for path interval A, whereas for path interval C, Y component $C_Y$ becomes the determining condition since Y component $C_Y$ is longer than X component $C_X$. Accordingly, the amount of time required to move along the path shown in FIG. 6A depends on the following: ($A_X+C_Y$).

Meanwhile, in the path shown in FIG. 6B, since X component $A_{X'}$ is longer than Y component $A_{Y'}$ in path interval A', X component $A_{X'}$ becomes the determining condition for path interval A', whereas for path interval C', X component $C_{X'}$ becomes the determining condition since X component $C_{X'}$ is longer than Y component $C_{Y'}$. Accordingly, the amount of time required to move along the path shown in FIG. 6A depends on the following: $(A_{X'}+C_{X'})$.

That is, of the paths in FIGS. 6A and 6B, in order to compare which path takes less time to move along, distance $(A_X+C_Y)$ and distance $(A_{X'}+C_{X'})$ should be compared.

Figure 7:
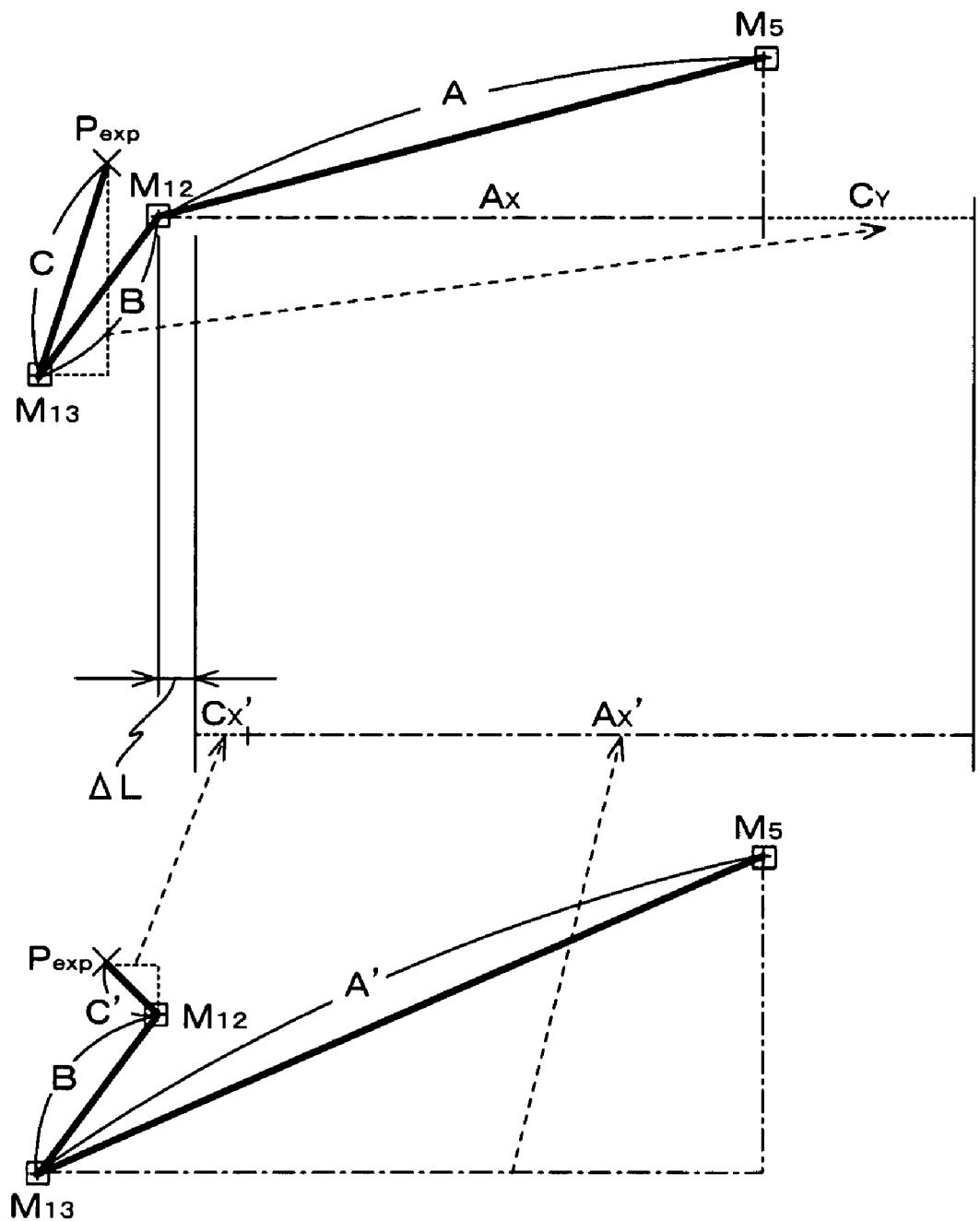
FIG. 7 is a schematic view that visually shows the amount of time it takes to move through the path in FIG. 6A and the path in FIG. 6B.

FIG. 7 is a schematic diagram that visually shows the amount of time required in the paths in FIGS. 6A and 6B. As is obvious from FIG. 7, when distance $(A_X+C_Y)$ and distance $(A_{X'}+C_{X'})$ are compared, distance $(A_X+C_Y)$ is longer by $\Delta L$. That is, equation (6) below is in effect.

$$\max\{A_X, A_Y\}+ \max\{C_{X'}, C_{Y'}\} < \max\{A_X, A_Y\}+\max\{C_X, C_Y\} \quad (6)$$

In equation (6), max{a,b} indicates that the larger value of a and b is to be used.

In this case, the time required for movement is shorter when the path shown in FIG. 6B is used when comparing the cases of using the paths shown in FIGS. 6A and 6B. Accordingly, by employing the path that satisfies both equations (5) and (6) at the same time as in this case, the path that has a shorter movement time can be chosen, in contradiction to the actual amount of distance.

As is described above, on selecting the next sample mark subject to detection, the movement time can be reduced, not by selecting the movement path that appears to have the shortest moving distance but by selecting the path that has a sequence which allows the shortest movement time throughout the entire path, such as by selecting the path in FIG. 6B in the example above.

In the example above, the movement method of the wafer only after the detection of the $6^{th}$ sample mark is described. However, it is desirable to determine the path in the manner described above, so that the total movement time of the path from the first position to the second position, that is, from wafer exchange position $P_{ch}$ to exposure starting position $P_{exp}$ is the shortest. In this case, it is desirable to determine the movement path by taking into consideration the total positional relation between the first position and the detection center of alignment detection system AS; the positional relation between the plurality of sample marks on wafer W; and the positional relation between the detection center of alignment detection system AS and the second position.

In addition, in the description above, for the sake of simplicity, the performance (drive thrust and drive speed) of the X-axis linear motor and Y-axis linear motors is the same and the acceleration ignored. However, in actual, the performance (drive thrust and maximum speed) and the maximum acceleration of the X-axis linear motor and Y-axis linear motors have to be considered. That is, it is desirable to choose the shortest path from various paths by calculating the time required to move along the distance of the X and Y components of each path interval, based on the positional relation of the first position, the detection center of alignment detection system AS, and the second position, and the positional relation among the sample marks as is described above, taking into consideration the maximum acceleration and the maximum speed of each of the linear motors. To be more specific, it is desirable to choose the path with the shortest movement time by deciding whether the X-axis or Y-axis component will be the determining condition, and calculating the movement time in such case. And, on choosing the path, the time it takes to reach the maximum speed (acceleration time), which is evolved from the maximum acceleration and the maximum speed, the time it takes for the speed to be zero from the maximum speed (deceleration time), the moving distance during the acceleration and deceleration, and the like should be taken into consideration.

The way to decide the path is not limited to using both the maximum speed and the maximum acceleration, and the path may be decided using either the maximum speed or the maximum acceleration. Furthermore, in the embodiment, each of the sample marks are set within the detection area of alignment detection system AS by the drive of wafer stage WST, and the detection of the sample marks begins when the positional change of wafer stage WST (wafer W) settles within a predetermined permissible range, however, the time it takes for the positional change to settle within the predetermined permissible range (settling time) may change, for example, according to acceleration or the like. Therefore, it is preferable to decide the path that allows the shortest movement time by taking into consideration such settling time, in addition to at least one of the maximum speed and the maximum acceleration referred to above. In addition, in case the exposure apparatus in FIG. 1 is a static type exposure apparatus (as in a stepper), it is also preferable to take into consideration the settling time that occurs on position setting of the first shot area on wafer W to the exposure position.

As is described in detail so far, in exposure apparatus 100 in the embodiment, while wafer W is moved from wafer exchange position $P_{ch}$ (the first position) to exposure starting position $P_{exp}$ (the second position) as is shown in FIG. 4 for wafer alignment by the EGA method described earlier before exposure begins, after wafer exchange has been performed, the wafer (wafer stage WST) is moved along a path so that the detection center of alignment detection system AS sequentially goes through the plurality of sample marks $M_{46}$, $M_{47}$, $M_{40}$, and so forth on wafer W. FIG. 4 shows as if the detection center of alignment detection system AS is moved, however, in actual, wafer stage WST on which wafer W is mounted is moved from the wafer exchange position $P_0$ (the first position) to the exposure starting position (the second position), via the plurality of points $P_1$, $P_2$, $P_3$, and so forth (these points are points that have a positional relation corresponding to the positional relation of sample marks $M_{46}$, $M_{47}$, $M_{40}$, and so forth arranged on the plurality of sample shot areas on wafer W) that are noncollinear with the wafer exchange position. The plurality of points is also noncollinear with the second position. On such movement, among the plurality of paths from the wafer exchange position $P_0$ (the first position) to the exposure starting position via the plurality of points $P_1$, $P_2$, $P_3$, and so forth, wafer stage WST is to be moved along a specific path that has the minimum total amount of time required for movement when adding up the longer component of either the X-axis direction component (the first axis direction component) or the Y-axis direction component (the second axis direction component) that has a longer movement time for each of the path intervals. That is, in the case X-axis linear motor 36X, which drives wafer stage WST in the X-axis direction (the first axis direction), and Y-axis linear motors $36Y_1$ and $36Y_2$, which drive wafer stage WST in the Y-axis direction (the second axis direction), simultaneously drive wafer stage WST, then wafer stage WST is moved along a specific path whose total time required for movement of the axis direction component serving as the determining condition is minimized. Consequently, it becomes possible to reduce the time required for moving wafer W from the wafer exchange position (the first position) to the exposure starting position (the second position) without fail.

In addition, in the embodiment, in order to simplify the description, the performance (drive thrust and drive speed) of X-axis linear motor 36X and Y-axis linear motors 36Y₁ and 36Y₂ was presumed to be the same, and each of the linear motors 36X, 36Y₁, and 36Y₂ were moved at a constant speed (acceleration time was ignored). Accordingly, the specific path described above coincides with the path in which the standstill time is minimum in both the X-axis and Y-axis linear motors, which drive wafer stage WST in the X-axis direction (the first axis direction) and the Y-axis direction (the second axis direction), respectively. In this case, the time that both the X-axis and Y-axis linear motors simultaneously drive wafer stage WST becomes extremely long, and during the simultaneous drive, the moving distance of wafer stage WST (wafer W) per unit time can be made longer than when wafer stage WST is driven using only either of the linear motors, which consequently allows the time required to move wafer W from the wafer exchange position (the first position) to the exposure starting position (the second position) to be reduced without fail.

In addition, in exposure apparatus 100 in the embodiment, information (array coordinates for each shot area) for moving the plurality of shot areas on wafer W to their scanning starting positions (reference positions) is calculated using the EGA calculation described earlier, based on the positional information of each of the sample marks detected by alignment detection system AS in the manner described above and the positional information (measurement values of the wafer interferometer) of wafer stage WST on the detection of each of the sample marks. Then, wafer W is moved based on the calculated information, and the pattern of reticle R is sequentially transferred onto the plurality of shot areas on wafer W by the step-and-scan method. Therefore, according to the embodiment, the time required for sample mark detection can be reduced, which allows the time required to be reduced for the entire series of the exposure processing. As a result, from the aspect of improving throughput, it becomes possible to improve the productivity of devices serving as end products.

In the embodiment above, eight shot areas on wafer W located closest to the outer periphery were selected as the sample shot areas, however, the number and the arrangement (position) of the sample shot areas and the sample marks are not limited to the ones shown in FIG. 3. For example, the number of sample shot areas and the sample marks are not limited to eight, as long as there are at least three sample marks, and the arrangement (position) is not limited to the outermost periphery, therefore, for example, shot areas adjacent to the inner side of the shot areas on the outermost periphery, or shot areas that are located around the center may also be selected.

In addition, in the embodiment above, the EGA method using equations (1) and (2) was employed as wafer alignment, however, wafer alignment is not limited to this method. For example, the so-called weighting EGA method may be employed in which the array coordinates of each of the shot areas are calculated by giving weighting to each of the alignment shot areas according to the distance of each shot area on the wafer and each of the plurality of alignment shot areas, as is disclosed in, for example, Japanese Patent No. 3339079 and the corresponding U.S. Pat. No. 5,525,808. Or, the so-called multiple point EGA method may be employed in which the array coordinates of the shot areas are calculated by detecting each of a plurality of sample marks in a plurality of alignment shot areas and taking into consideration the rotation, the orthogonal degree, and the like of the shot areas, as is disclosed in, for example, Japanese Patent Nos. 3289264 and 3348918, and the corresponding U.S. Pat. No. 6,278,957. That is, the alignment method of the wafer is optional. As long as the national laws in designated states (or elected states), to which this international application is applied, permit, the above disclosures of the publication and the corresponding U.S. patent are incorporated herein by reference.

In the embodiment above, the case has been described where two-dimensional marks were employed as alignment marks to obtain positional information in the X, Y two-dimensional directions. However, as the alignment marks, a one-dimensional mark may be employed, which are an X-mark that is used to obtain positional information only in the X-axis direction and a Y-mark that is used to obtain positional information only in the Y-axis direction. In the case of employing such one-dimensional marks, when considering wafer alignment by the EGA method previously described, a case may occur when alignment detection system AS is to detect each of the X- and Y-marks arranged in the same sample shot area. And, especially in the case when the two marks cannot be disposed within the detection area of alignment detection system AS at the same time (or in other words, when wafer stage WST has to be moved on detecting the two marks), the path with the shortest movement time should be decided also taking into consideration the position of these two marks. That is, it is desirable to move wafer stage WST along a movement path in which the positions of each of the X- and Y-marks pass through the detection position of alignment detection system AS while minimizing the movement time of wafer stage WST. In addition, in the multiple point EGA method, even if the sample marks are two-dimensional marks, because the sample marks are each formed at different positions in each shot area, it is preferable to determine the path with the shortest movement time also taking into consideration the position of such marks as in the EGA method described above.

In the embodiment above, the case has been described where the movement method of the present invention is applied when moving wafer W during the sample mark detection on wafer alignment by the EGA method. The present invention, however, is not limited to this, and for example, the movement path of the wafer on exposure or the like may also be decided in the same manner, and wafer W may be moved along the decided path. Or, in the case wafer alignment by the EGA method described earlier is performed following the so-called search alignment (such as, detection of search marks or the like by alignment detection system AS), the path whose sum of the longer amount of time for movement of the X-axis direction component and Y-axis direction component that takes longer for each path interval is minimum (or the path in which the standstill time is minimum in both the X-axis and Y-axis linear motors) maybe decided as the movement path as in the embodiment above, and wafer stage WST may be moved along the decided path. Furthermore, in the case of detecting at least one reference mark formed on a reference plate (or wafer holder 25) arranged on wafer stage WST before, after, or during the wafer alignment by the EGA method described earlier by alignment detection system AS or the like, the movement path of wafer stage WST may be decided so that the sum of the amount of time required for movement described above, including at least the one reference mark, is minimized (or the standstill time described above is substantially minimized). In addition, in the case of detecting the reference marks of wafer stage WST using the reticle alignment system (not shown) described earlier, the movement path of wafer stage WST may be decided in the same manner as in the embodiment above, including the mark detection by the reticle alignment system. In this case, the detection position of the mark by the reticle alignment system may be set between the wafer exchange position $P_{ch}$ (the first position) and the exposure starting position $P_{exp}$ (the second position), or the detection position may be set before the first position or after the second position. Especially in the former case, predetermined points that the plurality of points (such as alignment marks) on wafer stage WST pass through in between the first and second positions are two different points, that is, the mark detection position by alignment detection system AS and the mark detection position by the reticle alignment system. And, at least one point (such as a reference mark) of the plurality of points is to be detected by only the reticle alignment system, or can be detected by both the reticle alignment system and alignment detection system AS. That is, regardless of the position or the type of the mark on wafer stage WST, or the number, position, or the type of the mark detection system used for detection, and furthermore, regardless of the number or the position of predetermined points that the plurality of points pass through, as long as the wafer stage is moved from the first position to the second position via a plurality of points that include at least three noncollinear points, the amount of time required for movement can be reduced without fail as in the embodiment above, by moving wafer stage WST along a path that has the minimum total amount of time required for movement (or the path in which the standstill time is minimum in both the X-axis and Y-axis linear motors) is decided when adding up the longer component of either the X-axis direction component (the first axis direction component) or the Y-axis direction component (the second axis direction component) having a longer movement time for each of the path intervals.

In addition, in the embodiment above, the first position was described as wafer exchange position $P_{ch}$. The first position, however, is not limited to this. For example, the first position may also be the search alignment position described earlier, the detection position of the reference marks by the reticle alignment system, or the pre-alignment position for detecting the outer edge of the wafer. In the case the loading position of the wafer is different from the unloading position, either one of the positions can be the first position.

In addition, in the embodiment above, the second position is the exposure position (more particularly, the position corresponding to the center of the exposure area within the projection field of projection optical system PL where illumination light IL is irradiated, such as the optical axis position of projection optical system PL, however, in the embodiment above, since exposure apparatus 100 is a scanning exposure apparatus, the position is the starting position $P_{exp}$ for scanning exposure set at a predetermined relation with the exposure position, that is, one end of the exposure area in the scanning direction) where the reticle pattern is transferred via projection optical system PL. Therefore, wafer stage WST is to be moved so that the first shot area on the wafer is set to the exposure position (exposure starting position $P_{exp}$), after each of the plurality of points described earlier pass through the predetermined point. The second position, however, is not limited to the exposure position or the exposure starting position $P_{exp}$ described earlier. For example, the second position could be the acceleration starting position of the wafer stage (wafer) for performing scanning exposure, or it may also be the unloading position of the wafer. Furthermore, in the case exposure apparatus 100 is equipped with two wafer stages as is disclosed in, for example, International Publication Number WO98/24115 and the corresponding U.S. Pat. No. 6,341,007, or International Publication Number WO98/40791 and the corresponding U.S. Pat. No. 6,262,796, a position different from the exposure position or the exposure starting position may be decided as the second position. More particularly, in this exposure apparatus, while exposure processing of the wafer is being performed in parallel on one of the wafer stages arranged at the exposure position, detection of alignment marks and reference marks is performed by the alignment detection system on the other stage arranged at the detection position (alignment position) of the marks. Then, when the wafer stage that has completed the exposure processing is exchanged and the other stage is arranged at the exposure position, the reticle alignment system performs detection of the reference marks in prior to the exposure processing. Accordingly, the position where the reticle alignment system performs detection of the reference marks on the exposure position side may be decided as the second position. In addition, especially in the exposure apparatus whose details are disclosed in, International Publication Number WO98/40791, the exposure apparatus has a different wafer stage drive section arranged for the exposure position and the alignment position, and the wafer stage is delivered to and fro between the wafer drive section at the exposure position and the wafer drive section at the alignment position. Therefore, the delivery position (exchange position) of the wafer stage may be decided as the second position.

In addition, in the embodiment above, the case has been described where the first position, the second position, and the predetermined points (such as the mark detection position referred to above) that the plurality of points each pass through were set on the same coordinate system. However, at least one of the first position, the second position, and the predetermined points may be set on a different coordinate system. For example, in the exposure apparatus equipped with two wafer stages, the exposure position and the alignment position are set respectively on coordinate systems that are set by different interferometer systems. In this case, the wafer exchange position (such as the loading position) is set on the same coordinate system as the alignment position, whereas the mark detection position by the reticle alignment system is set on the same coordinate system as the exposure position. Furthermore, the first position, the second position, and the predetermined points do not all have to be set on the same or different coordinates. For example, in the case when the wafer exchange position is set outside the coordinate system on which the exposure position or the alignment position is set, the exchange position may be decided as the first or second position. In this case, the movement of the wafer stage outside the coordinate system can be controlled using a measurement unit (e.g. an encoder or the like) different from the interferometer system that sets the coordinate system.

In addition, the alignment method of the wafer is not limited to the EGA method described above, and the die-by-die method may also be employed. In the case of employing the die-by-die method, by employing the movement method of the present invention, wafer alignment can be performed within a shorter period of time.

A Second Embodiment

Figure 8:
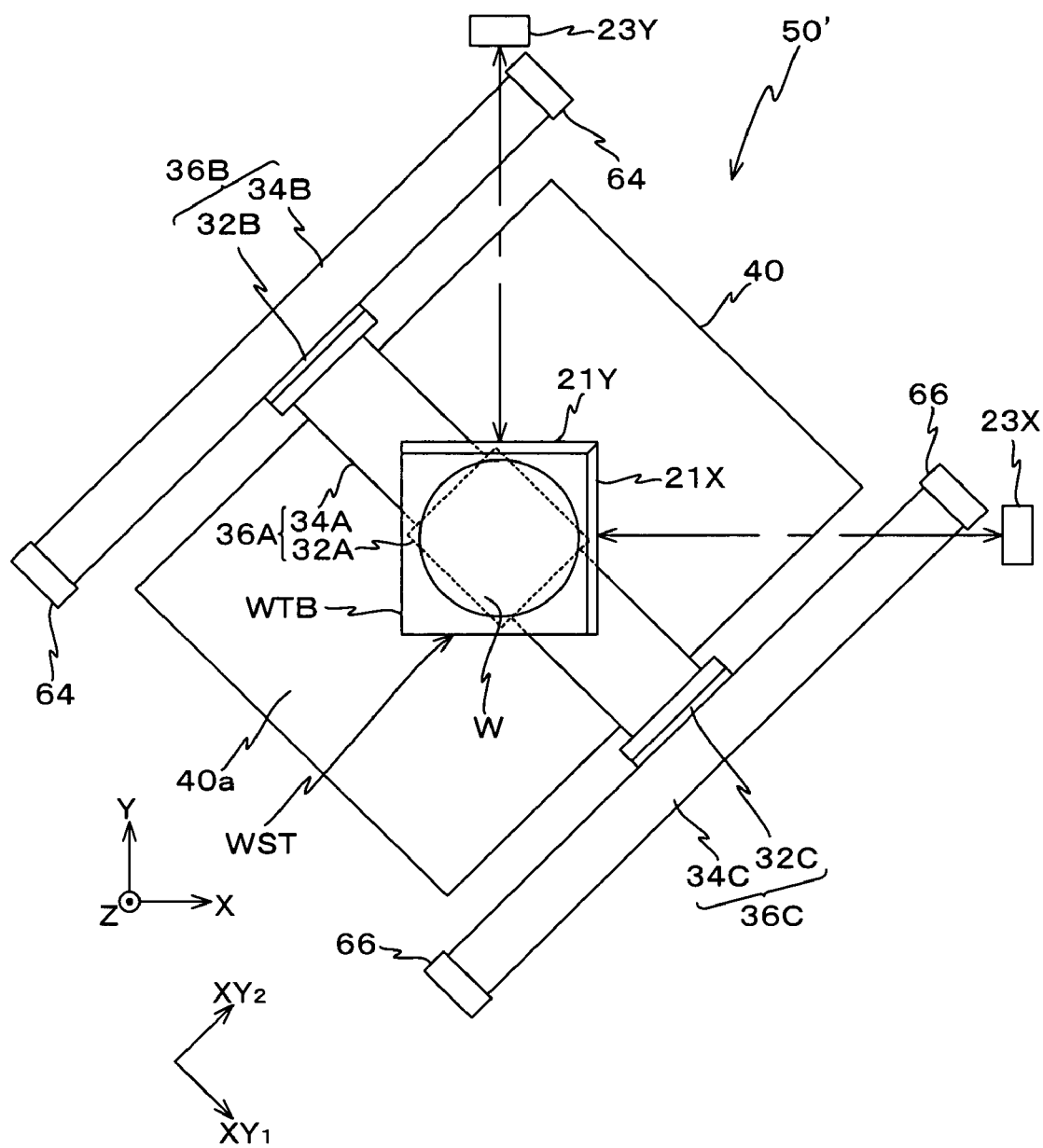
FIG. 8 is a planar view of an entire configuration of a stage unit related to a second embodiment of the present invention.

Next, a second embodiment of the present invention is described, referring to FIG. 8. For parts that have the same or similar arrangement as the first embodiment previously described, the same reference numerals will be used, and the description thereabout will be brief, or omitted.

FIG. 8 shows a planar view of a stage unit 50' related to the second embodiment. Stage unit 50' is equipped with a wafer stage WST, a wafer stage drive section, which drives wafer stage WST within a two-dimensional plane, and the like.

As in wafer stage WST in the first embodiment described earlier, wafer stage WST is equipped with a wafer stage main body (not shown), and a wafer table WTB mounted on the wafer stage main body via a Z-tilt drive mechanism (not shown). On the upper surface of wafer table WTB, a wafer W is held by suction, by vacuum chucking (or electrostatic suction) or the like via a wafer holder (drawing omitted).

The position of wafer table WTB within the XY plane and the rotation (the rotation amount (yawing amount) in the $\theta z$ direction, the rotation amount (pitching amount) in the $\theta x$ direction, and the rotation amount (rolling amount) in the $\theta y$ direction) are detected (measured) by an X-axis interferometer 23X and a Y-axis interferometer 23Y via movable mirrors 21X and 21Y, respectively, in the same manner as in the first embodiment previously described.

Meanwhile, the wafer stage drive section is equipped with a first linear motor 36A serving as a first drive unit, and a pair of second linear motors 36B and 36C serving as a second drive unit. The first linear motor 36A drives wafer stage WST in a first axis direction, which is a direction inclined with respect to the X-axis and the Y-axis at an angle of 45°, whereas the second linear motors 36B and 36C drives wafer stage WST integrally with the first linear motor 36A in a second axis direction, which is a direction orthogonal to the first axis direction within the XY plane. In the following description, for the sake of convenience, the first axis direction will be referred to as the $XY_1$-axis direction and the second axis direction will be referred to as the $XY_2$-axis direction (refer to FIG. 8).

In the second embodiment, as a stage base 40, a rectangular shaped object with a planar view (when viewed from above) is used. Stage base 40 is disposed so that its longitudinal direction is the $XY_2$-axis direction, and stage base 40 is supported substantially horizontal at a plurality of points (e.g. three or four points) on the floor surface (or a base plate, a frame caster, or the like) via vibration isolation units.

The first linear motor 36A has the same configuration as the X-axis linear motor 36X in the first embodiment described earlier. The first linear motor 36A has a mover 32A, which is arranged in the wafer stage main body of wafer stage WST, and a linear guide 34A extending in the $XY_1$-axis direction that generates the drive force in the $XY_1$-axis direction by electromagnetic interaction with mover 32A.

The pair of second linear motors 36B and 36C has the same configuration as the Y-axis linear motors $36Y_1$ and $36Y_2$. More particularly, one of the linear motors, the second linear motor 36B has a mover 32B arranged on one end in the longitudinal direction of linear guide 34A constituting the first linear motor 36A, and a linear guide 34B extending in the $XY_2$-axis direction that generates the drive force in the $XY_2$-axis direction by electromagnetic interaction with mover 32B. Linear guide 34B is held on both ends in the longitudinal direction on the $-XY_1$ side of stage base 40 by two support members 64 fixed on the floor surface. The other linear motor, the second linear motor 36C has a mover 32C arranged on the other end in the longitudinal direction of linear guide 34A, and a linear guide 34C extending in the $XY_2$-axis direction that generates the drive force in the $XY_2$-axis direction by electromagnetic interaction with mover 32C. Linear guide 34C is held on both ends in the longitudinal direction on the $+XY_1$ side of stage base 40 by two support members 66 fixed on the floor surface.

The point that wafer stage WST is supported by levitation in a noncontact manner above guide surface 40a referred to earlier via a clearance of around several μm, via gas hydrostatic bearings arranged on the bottom surface of wafer stage WST, and that linear guide 34A is supported by levitation (a clearance of around several μm is formed between each of the bearings and guide surface 40a) above guide surface 40a in a noncontact manner via gas hydrostatic bearings arranged on both ends of the lower surface side of linear guide 34A in the longitudinal direction are the same, as in the first embodiment.

The configuration or the like of other parts are similar to the ones in exposure apparatus 100 in the first embodiment described earlier.

In the exposure apparatus of the second embodiment that has the configuration described above, after the predetermined preparatory operations such as wafer exchange (or wafer loading) at the wafer exchange position, reticle alignment and baseline measurement by alignment detection system AS, wafer alignment by the EGA (Enhanced Global Alignment) method, and the like have been performed as in exposure apparatus 100 of the first embodiment previously described, exposure operation by the step-and-scan method is performed, and the circuit pattern of reticle R is transferred onto a plurality of shot areas on wafer W.

In the exposure apparatus of the second embodiment described above, wafer stage WST is driven in the $XY_1$-axis direction inclined by 45° with respect to the X-axis and Y-axis by the first linear motor 36A, and is also driven in the $XY_2$-axis direction orthogonal to the $XY_1$-axis by the second linear motors 36B and 36C. Meanwhile, the position of wafer stage WST in the scanning direction (Y-axis direction) is measured by interferometer 23Y that has length measurement axes parallel to the scanning direction. In this case, for example, because the first linear motor 36A and the second linear motors 36B and 36C are driven simultaneously on scanning exposure to drive wafer stage WST the scanning direction, it becomes possible to drive wafer stage WST within a shorter period of time than when wafer stage WST is driven in the scanning direction using a single drive unit with the same drive performance. On the other hand, in the case the time for driving wafer stage WST on scanning exposure is to be set at substantially the same level as the single drive unit referred to earlier, the drive performance level of each of the drive units (the first linear motor 36A, and the second linear motors 36B and 36C) can be lowered.

In addition, because the measurement axis direction of Y-axis interferometer 23Y is the scanning direction, it becomes possible to reduce the measurement errors of the position of wafer stage WST on scanning exposure, compared with the case when using an interferometer whose measurement axis direction is the $XY_1$-axis direction and the $XY_2$-axis direction. This is because, for example, when the position of wafer table WTB is measured with the $XY_1$-axis and $XY_2$-axis directions as the measurement axis direction, each measurement value has to be multiplied by $\sqrt{2}$ (the square root of two) so as to transform the results to measurement values in the Y-axis direction. And on this transformation, the errors of the measurement values of the interferometer are also multiplied by $\sqrt{2}$, which makes the measurement error larger than the actual measurement error. In the second embodiment, however, since the length measurement axes of Y-axis interferometer 23Y is in parallel with the Y-axis direction, it is possible to measure the position of wafer table WTB (wafer W) without overestimating the measurement errors.

Accordingly, in the second embodiment, the synchronous accuracy of reticle R and wafer W can be improved, which makes it possible to achieve exposure with higher overlay accuracy. In addition, in this case, because the non-scanning direction serves as the measurement axis direction for X-axis interferometer 23X, position measurement accuracy of wafer stage WST on stepping movement between shot areas is also good.

As a consequence, at least the yield of devices serving as end products can be improved, which makes it possible to improve the productivity of the devices.

In addition, in the exposure apparatus of the second embodiment, for example, on alignment by the EGA method describe earlier, the movement time of wafer stage WST can be minimized, by selecting the distance that appears to be shortest.

Furthermore, in the second embodiment, on driving wafer stage WST in the scanning direction, using two types of linear motors can reduce the heat generated in each of the linear motors. In addition, the temperature increase in each of the linear motors can be suppressed, and furthermore, the linear motors can be separately cooled, which can improve the cooling efficiency of the linear motors. Accordingly, the influence of heat to the periphery of the linear motors can be reduced, as well as extend the life of the linear motors.

In the second embodiment described above, the longitudinal direction of the first linear motor 36A and the second linear motors 36B and 36C (or to be more precise, the longitudinal direction of the linear guides that constitute each of the linear motors) have been set inclined at an angle of 45° to the X, Y-axis directions. The present invention, however, is not limited to this, and the longitudinal direction can be set at other various angles.

In addition, the exposure apparatus of the second embodiment may employ the movement method (and the modified example) of the wafer stage described in the first embodiment. Furthermore, in the second embodiment, the configuration of the stage unit is not limited to the arrangement shown in FIG. 8, and for example, a stage unit 50" shown in FIG. 9 can also be employed.

Figure 9:
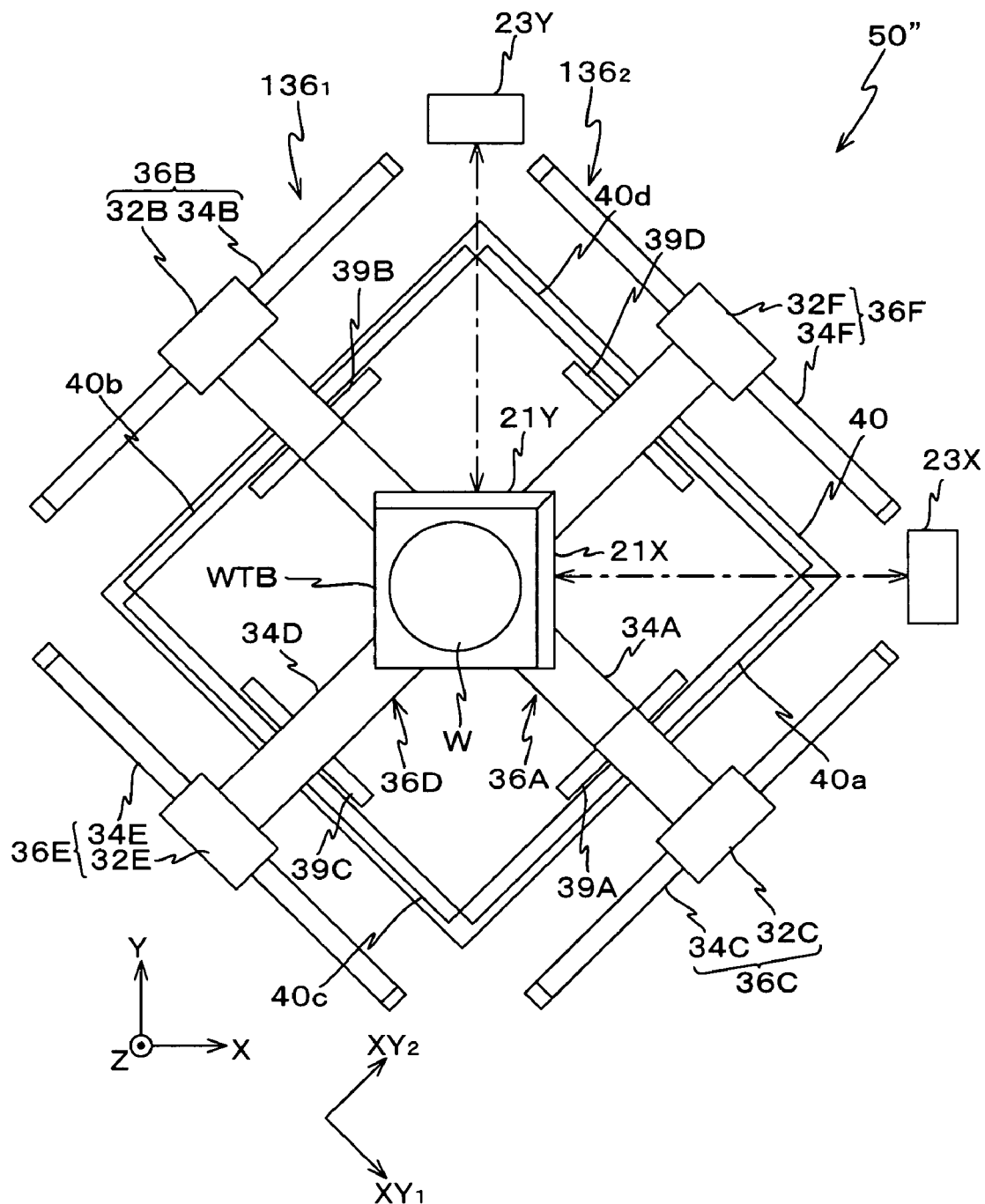
FIG. 9 is a planar view of a modified example of a stage unit related to the second embodiment.

More particularly, as is shown in FIG. 9, as the wafer stage drive section that drives wafer table WTB (wafer stage WST), a drive unit, which is configured of a first drive mechanism 136, that has a rough H-shape in a planar view (when viewed from above) and a second drive mechanism $136_2$ that has a structure symmetric to the first drive mechanism $136_1$ with respect to the X-axis (or the Y-axis), may be employed.

The first drive mechanism $136_1$ is equipped with an $XY_1$-axis fine movement linear motor 36A, which finely drives wafer table WTB in the $XY_1$-axis direction, and a pair of $XY_2$-axis coarse movement linear motors 36B and 36C, which drives wafer table WTB in the $XY_2$-axis direction in predetermined strokes.

$XY_1$-axis fine movement linear motor 36A is inserted into an opening formed penetrating wafer stage main body (not shown) in the $XY_1$-axis direction on which wafer table WTB is mounted. $XY_1$-axis fine movement linear motor 36A has a stator 34A that extends in the $XY_1$-axis direction, and a mover arranged in the wafer stage main body that generates the drive force for driving wafer stage main body (wafer table WTB) in the $XY_1$-axis direction by electromagnetic interaction with stator 34A.

The pair of $XY_2$-axis coarse movement linear motors 36B and 36C has movers 32B and 32C, and a pair of stators 34B and 34C. Movers 32B and 32C are arranged on both ends of stator 34A in the longitudinal direction, respectively, whereas stators 34B and 34C each extend in the $XY_2$-axis direction and integrally drive movers 32B and 32C, $XY_1$-axis fine movement linear motor 36A, and wafer stage main body (wafer table WTB) in the $XY_2$-axis direction by individually interacting electromagnetically with movers 32B and 32C.

In addition, on the lower surface (the surface that faces stage base 40) of stator 34A near both ends in the longitudinal direction, a pair of bearing mechanisms 39A and 39B are arranged facing guides 40a and 40b fixed to (protruded from) stage base 40, respectively.

The second drive mechanism $136_2$ is equipped with an $XY_2$-axis fine movement linear motor 36D, which finely drives wafer table WTB in the $XY_2$-axis direction, and a pair of $XY_1$-axis coarse movement linear motors 36E and 36F, which drives wafer table WTB in the $XY_1$-axis direction in predetermined strokes.

$XY_2$-axis fine movement linear motor 36D is inserted into an opening formed penetrating wafer stage main body (not shown) in the $XY_2$-axis direction. $XY_2$-axis fine movement linear motor 36D has a stator 34D that extends in the $XY_2$-axis direction, and a mover arranged in the wafer stage main body that generates the drive force for driving wafer stage main body (wafer table WTB) in the $XY_2$-axis direction by electromagnetic interaction with stator 34D. In this case, stator 34D and stator 34A described earlier are inserted into each opening formed in the wafer stage main body in a state where stators 34D and 34A intersect perpendicularly with a predetermined space in the vertical direction (the Z-axis direction).

The pair of $XY_1$-axis coarse movement linear motors 36E and 36F has movers 32E and 32F, and a pair of stators 34E and 34F. Movers 32E and 32F are arranged on both ends of stator 34D in the longitudinal direction, respectively, whereas stators 34E and 34F each extend in the $XY_1$-axis direction and integrally drive movers 32E and 32F, $XY_2$-axis fine movement linear motor 36D, and wafer stage main body (wafer table WTB) in the $XY_1$-axis direction by individually interacting electromagnetically with movers 32E and 32F.

In addition, on the lower surface (the surface that faces stage base 40) of stator 34D near both ends in the longitudinal direction, a pair of bearing mechanisms 39C and 39D are arranged facing guides 40c and 40d fixed to (protruded from) stage base 40, respectively.

According to the wafer stage drive section that has the configuration described above, the wafer stage drive section drives wafer table WTB (wafer stage) in the $XY_1$-axis direction with long strokes via $XY_1$-axis coarse movement linear motors 36E and 36F, while also driving wafer table WTB in the $XY_2$-axis direction with long strokes via $XY_2$-axis coarse movement linear motors 36B and 36C. In addition, the wafer stage drive section finely drives wafer table WTB in the $XY_1$-axis direction via $XY_1$-axis fine movement linear motor 36A, while also finely driving wafer table WTB in the $XY_2$-axis direction via $XY_2$-axis fine movement linear motor 36D. That is, according to the stage unit in FIG. 9, wafer table WTB (wafer stage WST) can be driven both roughly and finely within a two-dimensional plane (the same plane as the two-dimensional plane set by the X, Y-axes) set by the $XY_1$-axis and the $XY_2$-axis.

Even when such a stage unit is employed, the same effect as in the second embodiment above can be obtained.

Instead of using stage unit 50 (refer to FIG. 2) in the first embodiment described earlier, the stage unit in FIG. 9 whose drive directions of each linear motor is changed to directions parallel to the X, Y-axes may be employed.

In each of the embodiments above, the case has been described where the first drive unit and the second drive unit are composed of linear motors, and each linear motor has the shape of the letter H in a planar view (when viewed from above). The present invention, however, is not limited to this, and various configurations can be employed for the linear motors. In addition, the first and second drive units are not limited to linear motors, and various configurations can be employed as long as the drive unit can drive the stage in an axial direction.

In each of the embodiments above, the case has been described where the present invention is applied to an exposure apparatus equipped with a single wafer stage. The present invention, however, is not limited to this, and the present invention can also be applied to, for example, the exposure apparatus of the twin wafer stage type earlier described. As long as the national laws in designated states (or elected states), to which this international application is applied, permit, the disclosures of the above U.S. patents are incorporated herein by reference.

In each of the embodiments above, the case has been described where the present invention is applied to a wafer stage. The present invention, however, is not limited to this, and for example, in an exposure apparatus equipped with a measurement station that includes alignment detection system AS described earlier, and for example, a stage (measurement stage) different from the wafer stage that can be moved two-dimensionally on which the wafer subject to measurement by alignment detection system AS prior to the loading of the wafer onto the wafer stage, the present invention can be applied to the measurement stage. Furthermore, in each of the embodiments above, the case has been described where the present invention is applied to an exposure apparatus. The present invention, however, is not limited to this, and for example, the present invention can be applied to a measurement unit that connects inline with an exposure apparatus. In such configurations, the wafer whose mark positional information is measured with the measurement station or the measurement unit is moved to wafer stage WST by itself, or integrally with the wafer holder, and then the exposure processing described earlier is performed based on the measurement results. In this case, similar to each of the embodiments above, the wafer can be moved along the path with the shortest movement time, and also when the priority is set higher on accuracy rather than reducing the time required for movement, the number of mark positional information that can be measured within the same period of time can be increased. In addition, in each of the embodiments above, the mark detection by the alignment detection system is performed, moving the wafer along the movement path that has been decided. However, instead of or combined with the mark detection, other measurement may be performed at a position different from the exposure position, such as measuring height information (irregularity or step information) of the wafer (shot area) using the multiple focal point position detection system described earlier.

In each of the embodiments above, an ultra violet light source such as the KrF excimer laser (output wavelength 248 nm), a pulse laser light source of the vacuum ultraviolet region such as the $F_2$ laser or the ArF excimer laser, a mercury lamp, or the like has been used as the light source. The present invention, however, is not limited to this, and other vacuum ultraviolet light sources such as the $Ar_2$ laser light source (output wavelength 126 nm) may also be used. In addition, for example, the light used is not limited to only the laser beams output as vacuum ultraviolet light from each of the light sources referred to above, and a harmonic may be used that is obtained by amplifying a single wavelength laser in the infrared or visible region oscillated from a DFB semiconductor or a fiber laser with, for example, a fiber amplifier doped by erbium (Er) (or both Erbium and Ytterbium (Yb)), and performing wavelength conversion into ultraviolet light using a nonlinear optical crystal. Furthermore, not only can ultraviolet light be used as illumination light IL, but X-rays (including EUV light) or charged particle beams such as electron beams or ion beams may also be used as illumination light IL. The electron beam exposure apparatus that uses an electron beam as illumination light IL may employ any of the pencil beam method, variable beam shaping method, self projection method, blanking aperture array method, and mask projection method.

In each of the embodiments above, the case has been described where the present invention is applied to a scanning exposure apparatus by the step-and-scan method. However, it is a matter of course that the scope of the present invention is not limited to this. That is, the present invention can also be suitably applied to a reduction projection exposure apparatus by the step-and-repeat method or to an exposure apparatus by the step-and-stitch method.

The exposure apparatus in each of the embodiments above can be made by incorporating the illumination optical system made up of a plurality of lenses and the projection optical system into the main body of the exposure apparatus, performing optical adjustment, attaching parts such as the reticle stage and the wafer stage made up of multiple mechanical parts to the main body of the exposure apparatus, connecting the wiring and piping, and then, performing total adjustment (such as electrical adjustment and operation check). The exposure apparatus is preferably built in a clean room where conditions such as the temperature and the degree of cleanliness are controlled.

In addition, in each of the embodiments described above, the case has been described where the present invention is applied to exposure apparatus used for manufacturing semiconductor devices. The present invention, however, is not limited to this, and the present invention can be widely applied to an exposure apparatus for manufacturing liquid crystal displays which transfers a liquid crystal display deice pattern onto a square shaped glass plate, and to an exposure apparatus for manufacturing thin-film magnetic heads, imaging devices (such as CCDs), organic EL, micromachines, DNA chips, and the like.

In addition, the present invention can also be applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, or an electron beam exposure apparatus. Normally, in the exposure apparatus that uses DUV (deep (far) ultraviolet) light or VUV (vacuum ultraviolet) light, a transmittance type reticle is used, and as the reticle substrate, materials such as silica glass, fluorine-doped silica glass, fluorite, magnesium fluoride, or crystal are used.

The present invention may also be applied to an immersion type exposure apparatus that has liquid (such as pure water) filled between projection optical system PL and the wafer. Details on such an exposure apparatus are disclosed in, for example, the pamphlet of International Publication Number WO99/49504 or the like. The immersion exposure apparatus may be a scanning exposure type using a catadioptric projection optical system, or the exposure apparatus may be a static exposure type using a projection optical system that has a magnification of ⅛. In the latter immersion exposure apparatus, it is preferable to employ the step-and-stitch referred to earlier in order to form a large pattern onto an object such as a wafer.

<<Device Manufacturing Method>>

Figure 10:
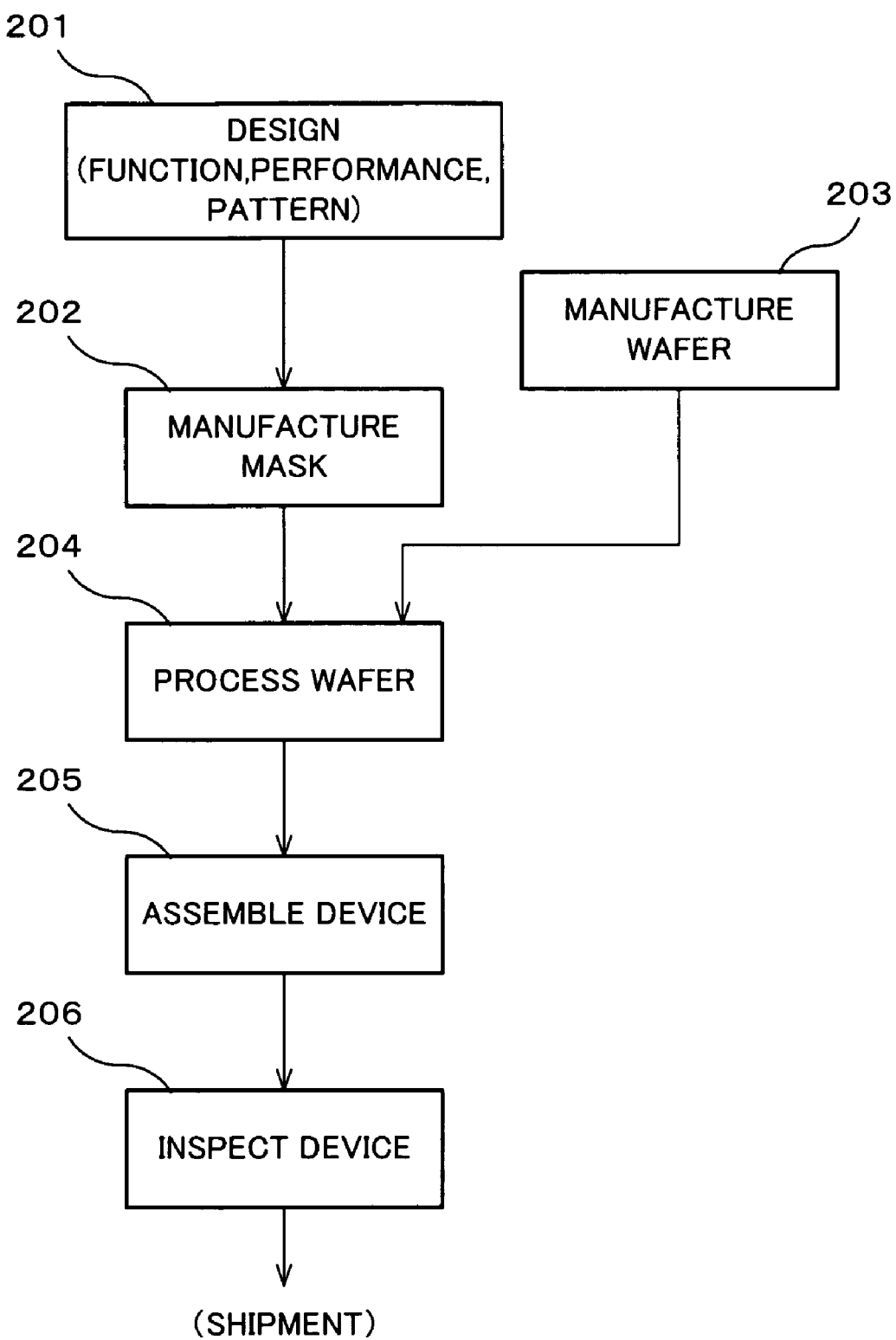
FIG. 10 is a flow chart for explaining an embodiment of a device manufacturing method according to the present invention.

FIG. 10 shows a flow chart of an example when manufacturing a device (like an IC or an LSI as in a semiconductor chip, a liquid crystal panel, a CCD, a thin magnetic head, a micromachine, or the like). As is shown in FIG. 10, in step 201 (design step), the function/performance design of a device (for example, designing a circuit for a semiconductor device) is performed, and pattern design to implement such function is performed. Then, in step 202 (mask manufacturing step), a mask on which the designed circuit pattern is formed is manufactured, whereas, in step 203 (wafer manufacturing step), a wafer is manufactured using materials such as silicon.

Next, in step 204 (wafer processing step), the actual circuit or the like is formed on the wafer by lithography or the like in a manner which will be described later on, using the mask and wafer prepared in steps 201 to 203. Then, in step 205 (device assembly step), device assembly is performed using the wafer processed in step 204. Step 205 includes processes such as the dicing process, the bonding process, and the packaging process (chip encapsulation) when necessary.

Finally, in step 206 (inspection step), tests on operation, durability, and the like are performed on the devices made in step 205. After these steps, the devices are completed and shipped out.

Figure 11:
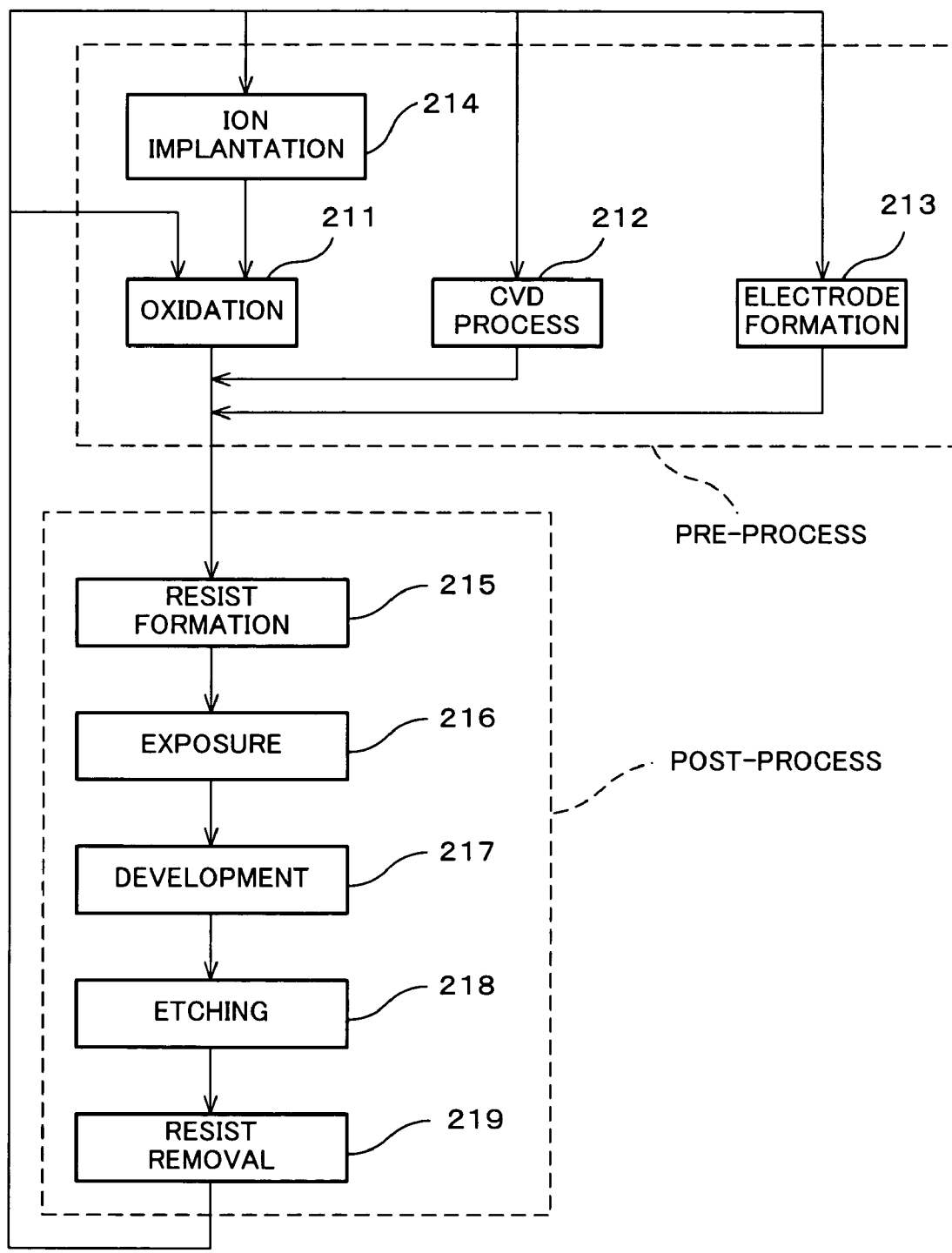
FIG. 11 is a flow chart for showing a detailed example of step 204 in FIG. 10.

FIG. 11 is a flow chart showing a detailed example of step 204 described above when manufacturing a semiconductor device. Referring to FIG. 11, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above make up a pre-process in each stage of wafer processing, and the necessary processing is chosen and is executed at each stage.

When the above pre-process is completed in each stage of wafer processing, a post-process is executed in the manner described below. In this post-process, first, in step 215 (resist formation step), the wafer is coated with a photosensitive agent. Next, in step 216 (exposure step), the circuit pattern on the mask is transferred onto the wafer by the exposure apparatus and the exposure method described above. And, in step 217 (development step), the wafer that has been exposed is developed. Then, in step 218 (etching step), an exposed member of an area other than the area where the resist remains is removed by etching. Finally, in step 219 (resist removing step), when etching is completed, the resist that is no longer necessary is removed.

By repeatedly performing such pre-process and post-process, multiple circuit patterns are formed on the wafer.

When the device manufacturing method described in this embodiment is used, because the exposure apparatus and the exposure method described in each of the embodiments above are used in the exposure process (step 216), the pattern of the reticle can be transferred on the wafer with high precision. As a consequence, the productivity (including the yield) of the highly integrated devices can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movement method in which a moving body is moved using a first drive unit and a second drive unit that generate a drive force in a first axis direction and a second axis direction perpendicular to said first axis direction, respectively, said movement method including:

moving said moving body along a specific path among a plurality of paths that start from a first position, pass through a plurality of points noncollinear with said first position, and reach a second position noncollinear with said plurality of points, said specific path having a minimum standstill time for said first and second drive units among said plurality of paths.

2. The movement method of claim 1, wherein the plurality of points through which said moving body passes when said moving body is moved from said first position to said second position include at least three noncollinear points.

3. The movement method of claim 2, wherein at least some points including said at least three noncollinear points are set to a positional relation that correspond to a positional relation of a plurality of reference points arranged on said moving body among said plurality of paths, and said specific path is set so that each of said plurality of reference points pass through a predetermined point during said movement.

4. The movement method of claim 3, wherein said plurality of reference points are arranged on an object mounted on said moving body.

5. The movement method of claim 2, wherein said plurality of points are all set in a positional relation that correspond to a positional relation of a plurality of reference points arranged on said moving body, and said specific path is set so that said plurality of reference points sequentially pass through a predetermined point during said movement.

6. The movement method of claim 5, wherein said plurality of reference points are arranged on an object mounted on said moving body.

7. The movement method of claim 3, wherein said specific path is decided based on a positional relation between said first position and said predetermined point, a positional relation in said plurality of reference points, a positional relation between said predetermined point and said second position, and at least one of maximum speed and maximum acceleration of said moving body by said first and second drive units.

8. The movement method of claim 3, wherein said predetermined point is a position of a mark detection system used to detect marks formed on said moving body, and said plurality of reference points include a reference point of at least three specific marks formed on an object mounted on said moving body.

9. The movement method of claim 8, wherein
said at least three specific marks are alignment marks used to adjust a positional relation of said object and said second position.

10. The movement method of claim 8, wherein
after said plurality of reference points each pass through said predetermined point, a plurality of areas on said object are each set as said second position according to detection results of said specific marks by said mark detection system.

11. An exposure method in which a predetermined pattern is transferred onto each of a plurality of divided areas on an object, said exposure method including:
detecting at least three specific marks on said object sequentially using said mark detection system, moving a moving body mounted on said object by a movement method according to claim 8; and
moving said moving body based on detection results of said mark detection system so as to set said plurality of divided areas to said second position where said pattern is transferred.

12. The exposure method of claim 11, wherein
in said detecting, said specific mark is selected from a plurality of alignment marks arranged corresponding to said plurality of divided areas on said object, and
in said moving, information for setting said plurality of divided areas on said object to said second position is calculated, based on detection results of said specific marks detected by said mark detection system and positional information of said moving body obtained on detection of each specific mark, said exposure method further including:
transferring in which said object is moved via said moving body based on said calculated information so as to transfer said pattern onto each of said plurality of divided areas.

13. The exposure method of claim 12, wherein
said information is array coordinates of a plurality of divided areas on said object in a reference coordinate system that sets the movement of said moving body.

14. A device manufacturing method including a lithography process, wherein
in said lithography process, a pattern is transferred onto an object using the exposure method in claim 11.

15. An exposure method in which a mask and an object are synchronously moved along a predetermined scanning direction to transfer a pattern formed on said mask onto said object, said exposure method including:
measuring positional information of a moving body where said object is mounted relative to said scanning direction with said scanning direction serving as a measurement axis direction, and driving said moving body synchronously with said mask in said scanning direction via the first and second drive units that respectively generate a drive force in a first axis direction and a second axis direction each intersecting said scanning direction, said first axis direction, said second axis direction and said scanning direction being parallel to a same plane.

16. A device manufacturing method including a lithography process, wherein
in said lithography process, a pattern is transferred onto an object using the exposure method in claim 15.

17. An exposure apparatus that transfers a predetermined pattern onto each of a plurality of divided areas on an object, said exposure apparatus comprising:
a moving body on which said object is mounted;
a first drive unit that drives said moving body in a first axis direction;
a second drive unit that drives said moving body in a second axis direction orthogonal to said first axis direction;
a mark detection system that detects marks formed on said moving body;
a processing unit that sequentially detects each of a specific mark using said detection system while controlling said first and second drive units, so that said moving body is moved along a specific path that has a minimum standstill time for said first and second drive units during movement along said specific path, out of a plurality of paths where at least three specific marks that are noncollinear with said object are sequentially moved to a detection position of said detection system while moving from a first position to a second position where said pattern is transferred; and
a control unit that controls said first and second drive units based on detection results of said mark detection system so as to set each of said plurality of divided areas on said object at said second position.

18. A device manufacturing method including a lithography process, wherein
in said lithography process, a pattern is transferred onto an object using the exposure apparatus in claim 17.

19. An exposure apparatus that moves a mask and an object synchronously in a predetermined scanning direction, and transfers a pattern formed on said mask onto said object, said exposure apparatus comprising:
a moving body on which said object is mounted;
a first drive unit and a second drive unit that drive said moving body in a first axis direction and a second axis direction, respectively, said first axis direction and said second axis direction each intersecting said scanning direction, said first axis direction, said second axis direction and said scanning direction being parallel to a same plane; and
a position measurement unit that measures positional information of said moving body relative to said scanning direction, with said scanning direction serving as a measurement axis direction.

20. The exposure apparatus of claim 19, wherein
said first axis direction and said second axis direction are set at an angle of 45° with respect to said scanning direction.

21. The exposure apparatus of claim 19, wherein
said position measurement unit is a light wave interference type length measuring instrument that irradiates a length measurement beam on a reflection surface arranged on said moving body and measures positional information relative to the scanning direction of said moving body by receiving reflected light from said reflection surface.

22. A device manufacturing method including a lithography process, wherein
in said lithography process, a pattern is transferred onto an object using the exposure apparatus in claim 19.

* * * * *